US012603043B2

(12) United States Patent
Park et al.

(10) Patent No.: US 12,603,043 B2
(45) Date of Patent: Apr. 14, 2026

(54) DISPLAY PANEL HAVING A PLURALITY OF LIGHT-EMITTING ELEMENTS WITH SEPARATORS

(71) Applicant: Samsung Display Co., Ltd., Yongin-si (KR)

(72) Inventors: Juchan Park, Yongin-si (KR); Sunho Kim, Yongin-si (KR); Chung Sock Choi, Yongin-si (KR); Pilsuk Lee, Yongin-si (KR); Sungjin Hong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/882,188

(22) Filed: Sep. 11, 2024

(65) Prior Publication Data

US 2025/0174187 A1     May 29, 2025

(30) Foreign Application Priority Data

Nov. 23, 2023     (KR) ........................ 10-2023-0163990

(51) Int. Cl.
| | |
|---|---|
| *G09G 3/3225* | (2016.01) |
| *G09G 3/32* | (2016.01) |
| *H10K 59/122* | (2023.01) |
| *H10K 59/88* | (2023.01) |

(52) U.S. Cl.
CPC ............. *G09G 3/3225* (2013.01); *G09G 3/32* (2013.01); *H10K 59/122* (2023.02); *H10K 59/88* (2023.02); *G09G 2320/0257* (2013.01)

(58) Field of Classification Search
CPC ..................................................... G09G 3/3225
USPC ......................................................... 345/204
See application file for complete search history.

(56) References Cited

U.S. PATENT DOCUMENTS

| | | | |
|---|---|---|---|
| 8,648,337 B2 | 2/2014 | Hsieh | |
| 10,707,438 B2 | 7/2020 | Kwon et al. | |
| 11,778,865 B2 | 10/2023 | Kwon et al. | |
| 11,910,655 B2 | 2/2024 | Kinjo | |
| 2018/0286925 A1* | 10/2018 | Kim | ........................ H10K 59/40 |
| 2020/0381508 A1* | 12/2020 | Jeon | ........................ H10K 59/38 |

(Continued)

FOREIGN PATENT DOCUMENTS

| | | |
|---|---|---|
| CN | 103280539 | 9/2013 |
| CN | 112861636 | 5/2021 |

(Continued)

*Primary Examiner* — Long D Pham
(74) *Attorney, Agent, or Firm* — F. CHAU & ASSOCIATES, LLC

(57) ABSTRACT

Provided is a display panel including a driving element layer having a pixel driver, a light-emitting element disposed on the driving element layer and having a first electrode, an intermediate layer disposed on the first electrode and having at least a light-emitting layer, and a second electrode disposed on the intermediate layer, a pixel-defining layer disposed on the driving element layer and having an opening exposing at least a portion of the first electrode, a connection electrode disposed on the pixel-defining layer and electrically connected to the pixel driver and the second electrode, and a separator disposed on the pixel-defining layer. In a contact region adjacent to the separator, a lower surface of the second electrode is in contact with an upper surface of the connection electrode.

29 Claims, 19 Drawing Sheets

(56) References Cited

U.S. PATENT DOCUMENTS

| | | | |
|---|---|---|---|
| 2021/0408163 A1 | 12/2021 | Heo et al. | |
| 2022/0059626 A1* | 2/2022 | Kwon | .................. H10K 50/844 |
| 2022/0399428 A1 | 12/2022 | Cha et al. | |
| 2023/0010053 A1 | 1/2023 | Nishimura et al. | |
| 2024/0016032 A1 | 1/2024 | Choi et al. | |
| 2024/0099072 A1 | 3/2024 | Hong et al. | |
| 2024/0147780 A1 | 5/2024 | Hong et al. | |

FOREIGN PATENT DOCUMENTS

| | | |
|---|---|---|
| EP | 3 506 361 | 7/2019 |
| KR | 10-2022-0000605 | 1/2022 |
| KR | 10-2022-0025965 | 3/2022 |
| KR | 10-2022-0167831 | 12/2022 |

* cited by examiner

DISPLAY PANEL HAVING A PLURALITY OF LIGHT-EMITTING ELEMENTS WITH SEPARATORS

CROSS-REFERENCE TO RELATED APPLICATION(S)

This application claims priority to and benefits of Korean Patent Application No. 10-2023-0163990 under 35 U.S.C. § 119, filed on Nov. 23, 2023, the entire contents of which are incorporated herein by reference.

BACKGROUND

1. Technical Field

Embodiments relate to a display panel with improved contact reliability.

2. Description of the Related Art

Multimedia electronic apparatuses, such as a television, a mobile phone, a tablet computer, a computer, a navigation system, and a game console, include display panels for displaying images. The display panel includes a light-emitting element and a circuit for driving the light-emitting element. The light-emitting elements, included in the display panel, emit light according to a voltage applied from the circuit, and generate the image. Research on the connection of the light-emitting element and the circuit is in progress in order to improve reliability of the display panel.

SUMMARY

Embodiments provide a display panel capable of improving contact reliability.

However, embodiments are not limited to those set forth herein. The above and other embodiments will become more apparent to one of ordinary skill in the art to which the disclosure pertains by referencing the detailed description of the disclosure given below.

An embodiment provides a display panel including a driving element layer including a pixel driver, a light-emitting element disposed on the driving element layer, and including a first electrode, an intermediate layer disposed on the first electrode and including at least a light-emitting layer, and a second electrode disposed on the intermediate layer, a pixel-defining layer disposed on the driving element layer, and including an opening exposing at least a portion of the first electrode, a connection electrode disposed on the pixel-defining layer and electrically connected to the pixel driver and the second electrode, and a separator disposed on the pixel-defining layer. In a contact region adjacent to the separator, a lower surface of the second electrode is in contact with an upper surface of the connection electrode.

In an embodiment, the intermediate layer may further include a functional layer. The functional layer may include a first intermediate functional layer disposed on the first electrode and a second intermediate functional layer disposed on the light-emitting layer, and the light-emitting layer may be disposed between the first intermediate functional layer and the second intermediate functional layer.

In an embodiment, the display panel may further include a first dummy layer disposed on the separator, and a second dummy layer disposed on the first dummy layer, wherein the first dummy layer and the functional layer may include a same material, and the second dummy layer and the second electrode may include a same material.

In an embodiment, the connection electrode may not be in contact with the second dummy layer.

In an embodiment, the connection electrode may have a ring shape surrounding the opening of the pixel-defining layer.

In an embodiment, the contact region may surround at least a portion of the opening of the pixel-defining layer.

In an embodiment, the connection electrode may include a first edge portion and a second edge portion surrounding the first edge portion, and the second edge portion may overlap the separator.

In an embodiment, the separator may include a first side surface and a second side surface having different taper angles with respect to an upper surface of the pixel-defining layer.

In an embodiment, a portion of the connection electrode may be covered by the separator.

In an embodiment, the connection electrode may include a first connection part disposed in the contact region, and a second connection part disposed on a side surface of the separator.

In an embodiment, the second electrode may include a first electrode part disposed on the first connection part to be in contact with an upper surface of the first connection part, and a second electrode part disposed on a side surface of the second connection part to be in contact with the side surface of the second connection part.

In an embodiment, the connection electrode may further include a third connection part disposed on an upper surface of the separator.

In an embodiment, at least a portion of the second connection part may not be in contact with the second electrode.

In an embodiment, a through-hole may pass through the pixel-defining layer, and the connection electrode may be connected to the pixel driver through the through-hole.

In an embodiment, the intermediate layer may overlap the through-hole.

In an embodiment, in an intermediate region disposed between the contact region and the light-emitting element, the intermediate layer may be disposed between the connection electrode and the second electrode.

In an embodiment, a display panel may include a driving element layer including a pixel driver, a light-emitting element disposed on the driving element layer, and including a first electrode, an intermediate layer disposed on the first electrode and including at least a light-emitting layer, and a second electrode disposed on the intermediate layer, a pixel-defining layer disposed on the driving element layer, and including an opening exposing at least a portion of the first electrode, and a connection electrode disposed on the pixel-defining layer and electrically connected to the pixel driver and the second electrode. In a contact region spaced apart from a light-emitting region where the light-emitting element is disposed, a lower surface of the second electrode is in contact with an upper surface of the connection electrode, and a connection region, where the connection electrode and the pixel driver are connected, is disposed between the contact region and the light-emitting region.

In an embodiment, in the pixel-defining layer, an opening overlapping the light-emitting region and exposing the portion of the first electrode, and a through-hole, spaced apart from the opening and overlapping the connection region, and the connection electrode may be connected to the pixel driver through the through-hole.

In an embodiment, the display panel may further include a separator disposed on the pixel-defining layer, and adjacent to the contact region.

In an embodiment, the connection electrode may include a first connection part disposed in the contact region, and a second connection part disposed on a side surface of the separator.

In an embodiment, the second electrode may include a first electrode part disposed on the first connection part to be in contact with an upper surface of the first connection part, and a second electrode part disposed on a side surface of the second connection part to be in contact with the side surface of the second connection part.

In an embodiment, the connection electrode may further include a third connection part disposed on an upper surface of the separator.

In an embodiment, at least a portion of the second connection part may not be in contact with the second electrode.

In an embodiment, the intermediate layer may further include a functional layer, and the display panel may further include a first dummy layer disposed on the separator, and a second dummy layer disposed on the first dummy layer, wherein the first dummy layer and the functional layer include a same material, and the second dummy layer and the second electrode include a same material.

In an embodiment, the connection electrode may not be in contact with the second dummy layer.

In an embodiment, a display panel may include a driving element layer including a plurality of pixel drivers, a plurality of light-emitting elements disposed on the driving element layer, and electrically connected respectively to the plurality of pixel drivers, a plurality of connection electrodes connected to the plurality of pixel drivers and the plurality of light-emitting elements, and a separator disposed between the plurality of light-emitting elements. Each of the plurality of light-emitting elements may include a first electrode, an intermediate layer disposed on the first electrode, and a second electrode disposed on the intermediate layer. In a contact region adjacent to the separator, a lower surface of the second electrode of each of the plurality of light-emitting elements is in contact with an upper surface of a corresponding connection electrode among the plurality of connection electrodes.

In an embodiment, the display panel may further include a pixel-defining layer disposed on the driving element layer, and including an opening exposing at least a portion of the first electrode of each of the plurality of light-emitting elements. A portion of each of the plurality of connection electrodes may be disposed on the pixel-defining layer, and the separator may be disposed on the pixel-defining layer.

In an embodiment, the plurality of light-emitting elements may include a first light-emitting element, a second light-emitting element spaced apart from the first light-emitting element in a first direction, and a third light-emitting element spaced apart from the first and second light-emitting elements in a second direction intersecting the first direction. In the pixel-defining layer, a first opening which exposes at least a portion of the first electrode of the first light-emitting element may be defined, a second opening which exposes at least a portion of the first electrode of the second light-emitting element may be defined, and a third opening which exposes at least a portion of the first electrode of the third light-emitting element may be defined. The plurality of connection electrodes may include a first connection electrode surrounding the first opening, a second connection electrode surrounding the second opening, and a third connection electrode surrounding the third opening.

In an embodiment, the plurality of pixel drivers may include a first pixel driver electrically connected to the first light-emitting element, a second pixel driver electrically connected to the second light-emitting element, and a third pixel driver electrically connected to the third light-emitting element. A first through-hole, a second through-hole, and a third through-hole may pass through the pixel-defining layer. The first connection electrode may be connected to the first pixel driver through the first through-hole, the second connection electrode may be connected to the second pixel driver through the second through-hole, and the third connection electrode may be connected to the third pixel driver through the third through-hole.

BRIEF DESCRIPTION OF THE DRAWINGS

The accompanying drawings are included to provide a further understanding of the invention, and are incorporated in and constitute a part of this specification. The drawings illustrate embodiments and, together with the description, serve to explain principles of the invention. In the drawings.

DETAILED DESCRIPTION OF THE EMBODIMENTS

Figure 1:
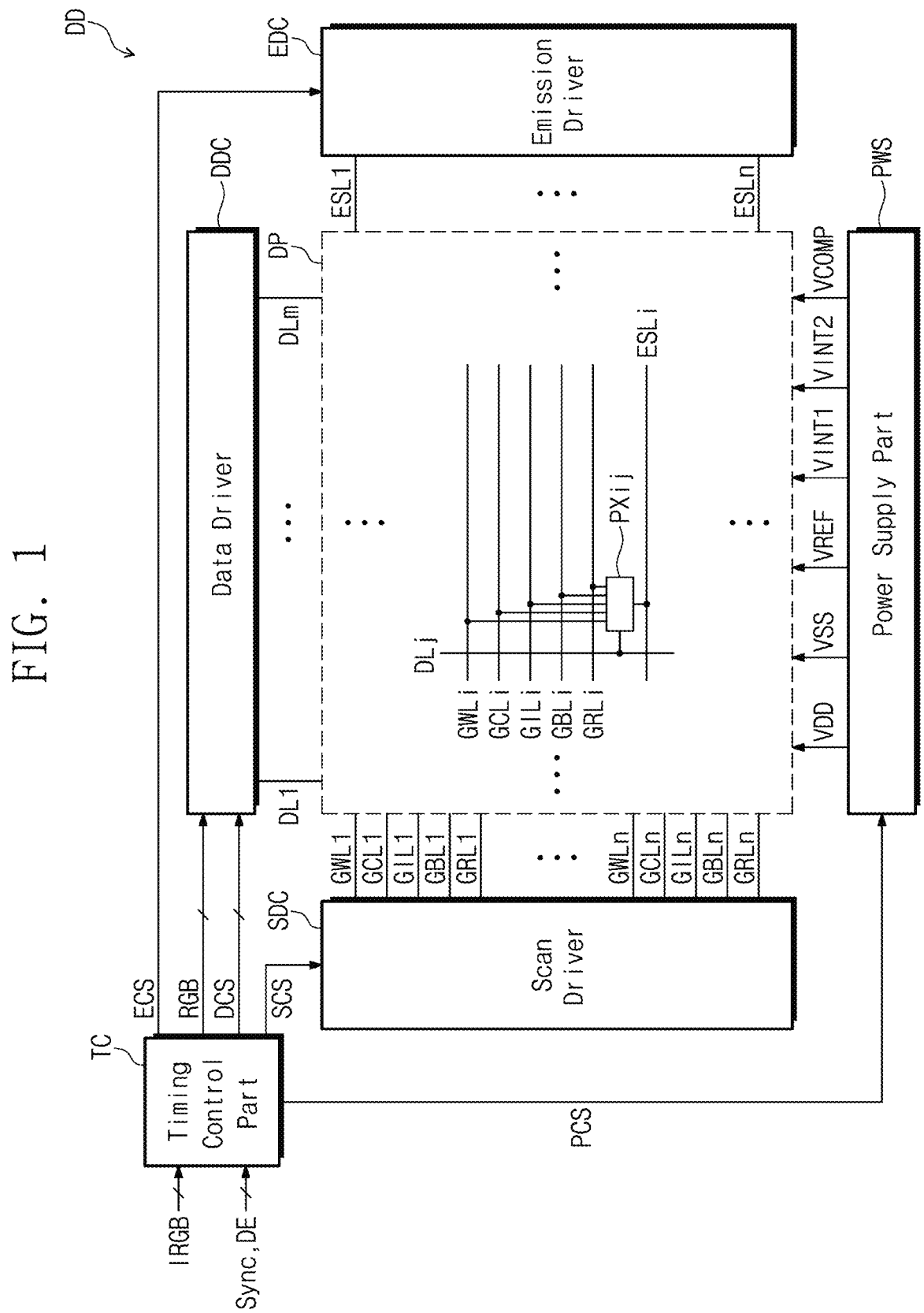
FIG. 1 is a schematic block diagram of a display device according to an embodiment.

In the following description, for the purposes of explanation, numerous specific details are set forth in order to provide a thorough understanding of various embodiments or implementations of the invention. As used herein, "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the scope of the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element or a layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the axis of the first direction DR1, the axis of the second direction DR2, and the axis of the third direction DR3 are not limited to three axes of a rectangular coordinate system, such as the X, Y, and Z-axes, and may be interpreted in a broader sense. For example, the axis of the first direction DR1, the axis of the second direction DR2, and the axis of the third direction DR3 may be perpendicular to one another, or may represent different directions that are not perpendicular to one another. For the purposes of this disclosure, "at least one of A and B" may be understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Hereinafter, embodiments are described with reference to the accompanying drawings.

FIG. 1 is a block diagram of a display device DD according to an embodiment.

Referring to FIG. 1, the display device DD may include a display panel DP, a panel driver SDC, EDC, or DDC, a power supply part PWS, and a timing control part TC. In an embodiment, the display panel DP is described as an emission-type display panel. The emission-type display panel may include an organic light-emitting display panel, an inorganic light-emitting display panel, or a quantum-dot light-emitting display panel. In an embodiment to be described later, the organic light-emitting display panel is described in detail as an example. The panel driver SDC, EDC, or DDC may include a scan driver SDC, an emission driver EDC, and a data driver DDC.

The display panel DP may include scan lines GWL1 to GWLn, GCL1 to GCLn, GIL1 to GILn, GBL1 to GBLn, and GRL1 to GRLn, emission lines ESL1 to ESLn, and data lines DL1 to DLm. The display panel DP may include pixels connected to the scan lines GWL1 to GWLn, GCL1 to GCLn, GIL1 to GILn, GBL1 to GBLn, and GRL1 to GRLn, the emission lines ESL1 to ESLn, and the data lines DL1 to DLm (where m and n are integers greater than 1).

For example, a pixel PXij (where i and j are integers greater than 1) positioned on an i-th horizontal line (or i-th pixel row) and a j-th vertical line (or j-th pixel column) may be connected to an i-th first scan line (or write scan line GWLi), an i-th second scan line (or compensation scan line GCLi), an i-th third scan line (or first initialization scan line GILi), an i-th fourth scan line (or second initialization scan line GBLi), an i-th fifth scan line (or reset scan line GRLi), a j-th data line DLj, and an i-th emission line ESLi.

The pixel PXij may include light-emitting elements, transistors, and capacitors. The pixel PXij may receive a first power voltage VDD, a second power voltage VSS, a third power voltage (or reference voltage VREF), a fourth power voltage (or first initialization voltage VINT1), a fifth power voltage (or second initialization voltage VINT2), and a sixth power voltage (or compensation voltage VCOMP) through the power supply part PWS.

The voltage values of the first power voltage VDD and the second power voltage VSS may be set such that currents may flow into the light-emitting element to emit light. For example, the first power voltage VDD may be set to be higher than the second power voltage VSS.

The third power voltage VREF may be a voltage for initializing a gate of a driving transistor included in the pixel PXij. The third power voltage VREF may be used for providing a certain gradation by using the voltage difference from a data signal. For this, the third power voltage VREF may be set to a certain voltage within a voltage range of the data signal.

The fourth power voltage VINT1 may be a voltage for initializing the capacitor included in the pixel PXij. The fourth power voltage VINT1 may be set to be lower than the third power voltage VREF. For example, the fourth power voltage VINT1 may be set to be lower than the difference between the third power voltage VREF and a threshold voltage of the driving transistor. However, embodiments are not limited thereto.

The fifth power voltage VINT2 may be a voltage for initializing a cathode of the light-emitting element included in the pixel PXij. The fifth power voltage VINT2 may be set to be lower than the first power voltage VDD or the fourth power voltage VINT1, or set to be similar with or same as the third power voltage VREF, but embodiments are not limited thereto, and the fifth power voltage VINT2 may also be set to be similar with or same as the first power voltage VDD.

The sixth power voltage VCOMP may provide a certain current to the driving transistor in case that the threshold voltage of the driving transistor is compensated.

FIG. 1 illustrates that all of the first to sixth power voltages VDD, VSS, VREF, VINT1, VINT2, and VCOMP are supplied from the power supply part PWS, but embodiments are not limited thereto. For example, all of the first power voltage VDD and the second power voltage VSS may be supplied regardless of the structure of the pixel PXij, and at least one voltage of the third power voltage VREF, the fourth power voltage VINT1, the fifth power voltage VINT2, or the sixth power voltage VCOMP may not be supplied in correspondence to the structure of the pixel PXij.

According to an embodiment, signal lines, connected to the pixel PXij, may be variously set in correspondence to the circuit structure of the pixel PXij.

The scan driver SDC may receive a first control signal SCS from the timing control part TC, and based on the first control signal SCS, the scan driver SDC may provide a scan signal to each of the first scan lines GWL1 to GWLn, the second scan lines GCL1 to GCLn, the third scan lines GIL1 to GILn, the fourth scan lines GBL1 to GBLn, and the fifth scan lines GRL1 to GRLn.

The scan signal may be set to a voltage at which transistors, receiving the scan signal, are turned on. For example, the scan signal, which is provided to a P-type transistor, may be set to a logic low level, and the scan signal, which is provided to an N-type transistor, may be set to a logic high level. Hereinafter, the meaning of "the scan signal being provided" may be understood that the scan signal is provided with a logic level at which a transistor controlled by the scan signal is turned on.

For the convenience of description, FIG. 1 illustrates the scan driver SDC in a single component, but embodiments are not limited thereto. According to an embodiment, scan drivers may be included in order to provide the scan signal to each of the first scan lines GWL1 to GWLn, the second scan lines GCL1 to GCLn, the third scan lines GIL1 to GILn, the fourth scan lines GBL1 to GBLn, and the fifth scan lines GRL1 to GRLn.

The emission driver EDC may provide an emission signal to the emission lines ESL1 to ESLn based on a second control signal ECS. For example, the emission signal may be provided to the emission lines ESL1 to ESLn in sequence.

The transistors connected to the emission lines ESL1 to ESLn, according to an embodiment, may be N-type transistors. For example, the emission signal provided to the emission lines ESL1 to ESLn may be set to a gate-off voltage. The transistors that receive the emission signal may be turned off in case that the emission signal is provided, and may be set to a turned-on state in the other cases.

The second control signal ECS may include an emission start signal and clock signals, and the emission driver EDC may be provided as a shift register that sequentially shifts the emission start signal in a pulse type, by using the clock signals, to thereby sequentially generate and output the pulse-type emission signal.

The data driver DDC may receive a third control signal DCS and image data RGB from the timing control part TC. The data driver DDC may convert the image data RGB in digital format into an analog data signal (e.g., data signal). The data driver DDC may provide the data signal to the data lines DL1 to DLm in response to the third control signal DCS.

The third control signal DCS may include a data enable signal, a horizontal start signal, a data clock signal, etc., directing output of a valid data signal. For example, the data driver DDC may include a shift register that shifts the horizontal start signal in synchronization with the data clock signal and generates a sampling signal, a latch that latches the image data RGB in response to the sampling signal, a digital-analog converter (or decoder) that converts the latched image data (for example, data in digital format) into data signals in analog format, and buffers (or amplifiers) that output the data signals to the data lines DL1 to DLm.

The power supply part PWS may supply the first power voltage VDD, the second power voltage VSS, and the third power voltage VREF, for driving the pixel PXij, to the display panel DP. For example, the power supply part PWS may supply at least one voltage of the fourth power voltage VINT1, the fifth power voltage VINT2, or the sixth power voltage VCOMP.

Figure 2A:
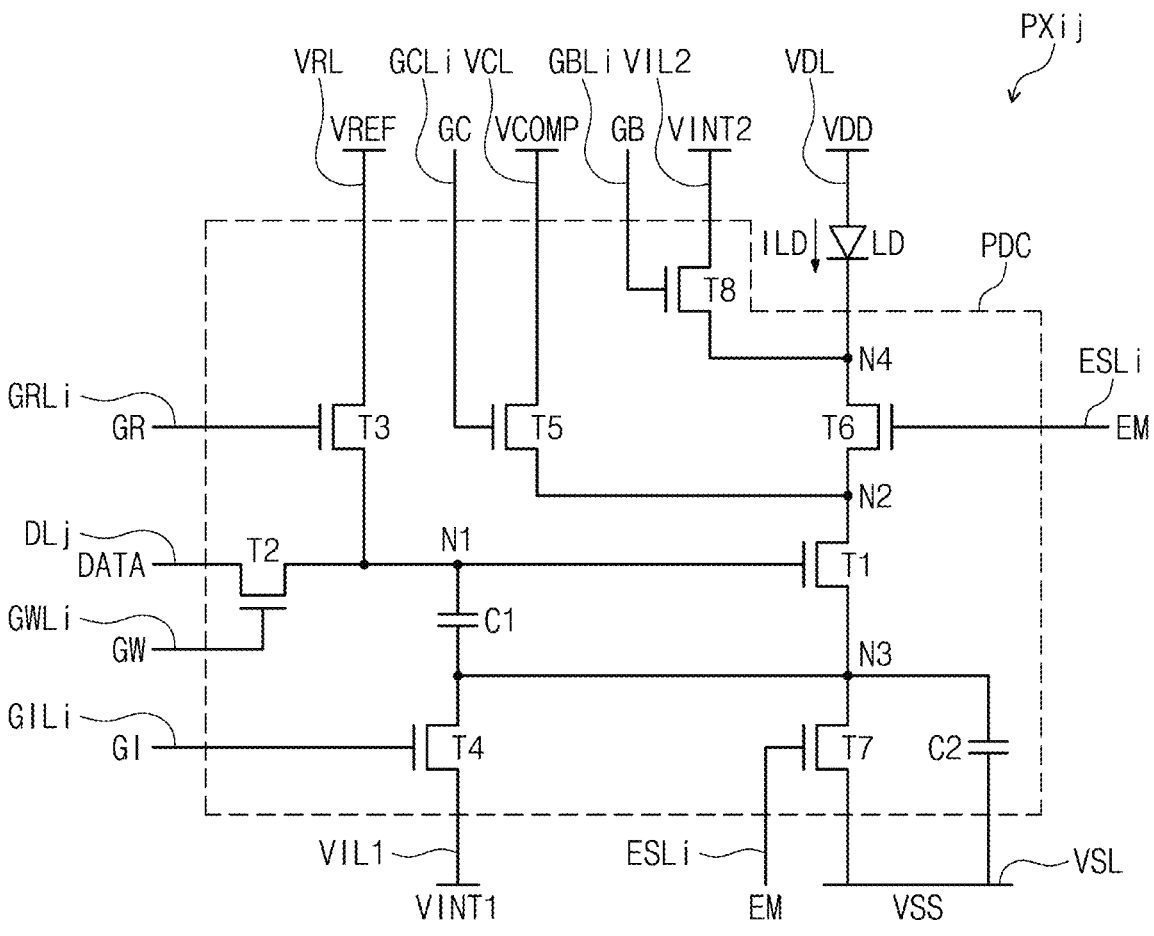
FIG. 2A is a schematic diagram of an equivalent circuit of a pixel according to an embodiment.

For example, the power supply part PWS may supply the first power voltage VDD, the second power voltage VSS, the third power voltage VREF, the fourth power voltage VINT1, the fifth power voltage VINT2, and the sixth power voltage VCOMP to the display panel DP, respectively via a first power line VDL (see FIG. 2A), a second power line VSL (see FIG. 2A), a third power line (or reference voltage line VRL, see FIG. 2A), a fourth power line (or first initialization voltage line VIL1, see FIG. 2A), a fifth power line (or second initialization voltage line VIL2, see FIG. 2A), and a sixth power line (or compensation voltage line VCL, see FIG. 2A).

The power supply part PWS may be provided as a power management integrated circuit, but embodiments are not limited thereto.

The timing control part TC may generate the first control signal SCS, the second control signal ECS, the third control signal DCS, and the fourth control signal PCS based on an input image data IRGB, a synchronization signal Sync (for example, a vertical synchronization signal, a horizontal synchronization signal, etc.), the data enable signal DE, the clock signal, and the like. The first control signal SCS may be provided to the scan driver SDC, the second control signal ECS may be provided to the emission driver EDC, the third control signal DCS may be provided to the data driver DDC, and the fourth control signal PCS may be provided to the power supply part PWS. The timing control part TC may generate the image data RGB (or frame data) by rearranging the input image data IRGB in correspondence to the arrangement of the pixel PXij in the display panel DP.

For example, the scan driver SDC, the emission driver EDC, the data driver DDC, the power supply part PWS, and/or the timing control part TC may be formed (e.g., directly formed) on the display panel DP, or provided as a separate driving chip to be connected to the display panel DP. For example, at least two of the scan driver SDC, the emission driver EDC, the data driver DDC, the power supply part PWS, or the timing control part TC may also be provided as a single driving chip. For example, the data driver DDC and the timing control part TC may also be provided as a single driving chip.

In the above, the display device DD according to an embodiment has been described with reference to FIG. 1, but embodiments are not limited thereto. According to the configuration of the pixel, the signal lines may be further included or may be omitted. For example, the connecting relationship between a pixel and the signal lines may be changed. In case of omitting any one among the signal lines, another signal line may replace the omitted signal line.

Figure 2B:
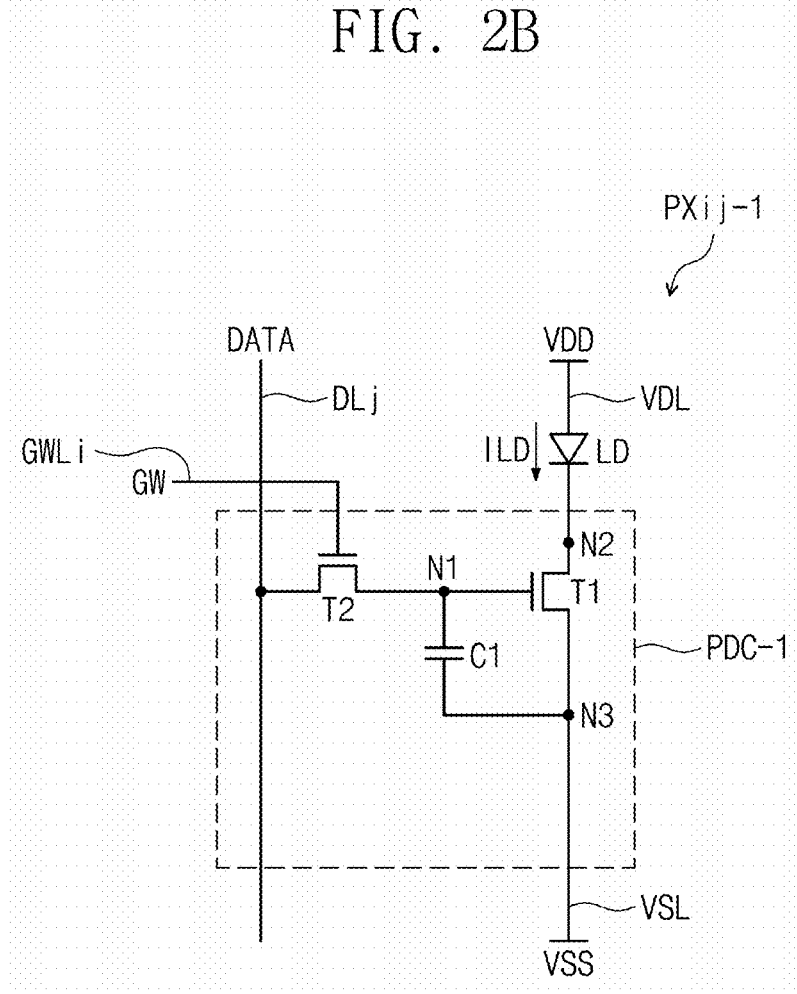
FIG. 2B is a schematic diagram of an equivalent circuit of a pixel according to an embodiment.
Figure 2C:
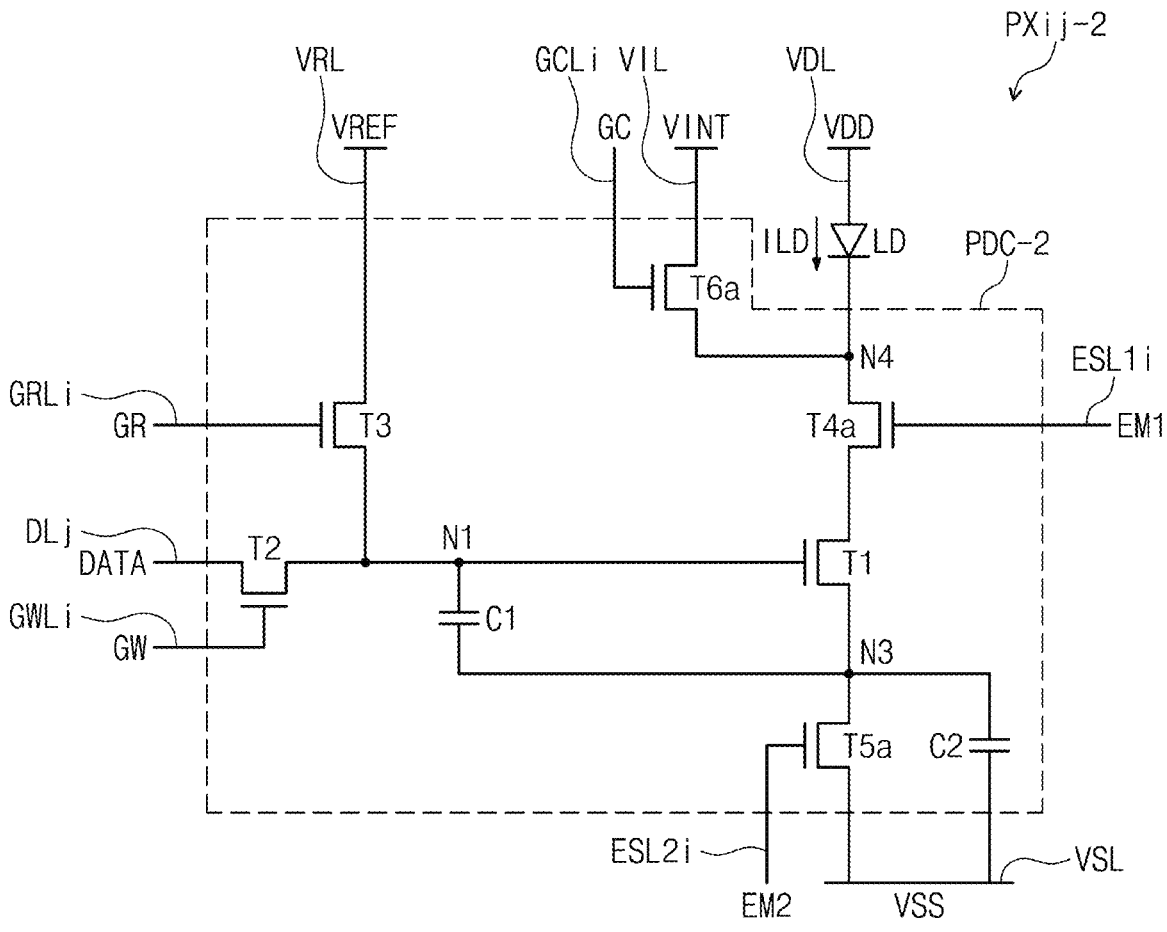
FIG. 2C is a schematic diagram of an equivalent circuit of a pixel according to an embodiment.

FIGS. 2A, 2B, and 2C are schematic diagrams of equivalent circuits of a pixel according to an embodiment. FIGS. 2A, 2B, and 2C illustrate respective schematic diagrams of equivalent circuits of the pixels PXij, PXij-1, and PXij-2 connected to an i-th first scan line GWLi (hereinafter, first scan line) and connected to a j-th data line DLj (hereinafter, data line).

As illustrated in FIG. 2A, the pixel PXij may include a light-emitting element LD and a pixel driver PDC. The light-emitting element LD may be connected to a first power line VDL and the pixel driver PDC.

The pixel driver PDC may be connected to scan lines GWLi, GCLi, GILi, GBLi, and GRLi, a data line DLj, an emission line ESLi, and power voltage lines VDL, VSL, VIL1, VIL2, VRL, and VCL. The pixel driver PDC may include first to eighth transistors T1, T2, T3, T4, T5, T6, T7, and T8, a first capacitor C1, and a second capacitor C2. Hereinafter, each of the first to eighth transistors T1, T2, T3, T4, T5, T6, T7, and T8 is described as an N-type transistor as an example. However, embodiments are not limited thereto, and some of the first to eighth transistors T1 to T8 may be N-type transistors, and the others may be P-type transistors, or each of the first to eighth transistors T1 to T8 may be a P-type transistor, and the type is not limited to any one embodiment.

A gate of the first transistor T1 may be connected to a first node N1. A first electrode of the first transistor T1 may be connected to a second node N2, and a second electrode of the first transistor T1 may be connected to a third node N3. The first transistor T1 may be a driving transistor. The first transistor T1 may control a driving current ILD flowing from the first power line VDL to a second power line VSL via the light-emitting element LD in response to a voltage of the first node N1. For example, a first power voltage VDD may be set to have a higher potential than that of a second power voltage VSS.

In the description, "a transistor being electrically connected to a signal line or a transistor being electrically connected to a transistor" means "a source, drain, and gate of the transistor having an integrated shape with the signal line, or being connected through a connection electrode".

The second transistor T2 may include a gate connected to a write scan line GWLi, a first electrode connected to the data line DLj, and a second electrode connected to the first node N1. The second transistor T2 may provide a data signal DATA to the first node N1 in response to a write scan signal GW transmitted through the write scan line GWLi. The second transistor T2 may be turned on in case that the write scan signal GW is provided to the write scan line GWLi, and may thus electrically connect the data line DLj and the first node N1.

The third transistor T3 may be connected between the first node N1 and a reference voltage line VRL. A first electrode of the third transistor T3 may receive a reference voltage VREF through the reference voltage line VRL, and a second electrode of the third transistor T3 may be connected to the first node N1. In an embodiment, a gate of the third transistor T3 may receive a reset scan signal GR through an i-th fifth scan line GRLi (hereinafter, reset scan line). The third transistor T3 may be turned on in case that the reset scan signal GR is provided to the reset scan line GRLi, and may thus provide the reference voltage VREF to the first node N1.

The fourth transistor T4 may be connected between a third node N3 and a first initialization voltage line VIL1. A first electrode of the fourth transistor T4 may be connected to the third node N3, and a second electrode of the fourth transistor T4 may be connected to the first initialization voltage line VIL1 that provides a first initialization voltage VINT1. The fourth transistor T4 may be referred to as a first initialization transistor. A gate of the fourth transistor T4 may receive a first initialization scan signal GI through an i-th third scan line GILi (hereinafter, first initialization scan line). The fourth transistor T4 may be turned on in case that the first initialization scan signal GI is provided to the first initialization scan line GILi, and may thus provide the first initialization voltage VINT1 to the third node N3.

The fifth transistor T5 may be connected between a compensation voltage line VCL and the second node N2. A first electrode of the fifth transistor T5 may receive a compensation voltage VCOMP through the compensation voltage line VCL, and a second electrode of the fifth transistor T5 may be connected to the second node N2 to be electrically connected to the first electrode of the first transistor T1. A gate of the fifth transistor T5 may receive a compensation scan signal GC through an i-th second scan line GCLi (hereinafter, compensation scan line). The fifth transistor T5 may be turned on in case that the compensation scan signal GC is provided to the compensation scan line GCLi, and provide the compensation voltage VCOMP to the second node N2, so that a threshold voltage of the first transistor T1 may be compensated during a compensation period.

The sixth transistor T6 may be connected between the first transistor T1 and the light-emitting element LD. For example, a gate of the sixth transistor T6 may receive an emission signal EM through an i-th emission line ESLi (hereinafter, emission line). A first electrode of the sixth transistor T6 may be connected to a cathode of the light-emitting element LD through a fourth node N4, and a second electrode of the sixth transistor T6 may be connected to the first electrode of the first transistor T1 through the second node N2. The sixth transistor T6 may be referred to as a first emission control transistor. The sixth transistor T6 may be turned on in case that the emission signal EM is provided to the emission line ESLi, and may electrically connect the light-emitting element LD and the first transistor T1.

The seventh transistor T7 may be connected between a second power line VSL and the third node N3. A first electrode of the seventh transistor T7 may be connected to the second electrode of the first transistor T1 through the third node N3, and a second electrode of the seventh transistor T7 may receive the second power voltage VSS through the second power line VSL. A gate of the seventh transistor T7 may be electrically connected to the emission line ESLi. The seventh transistor T7 may be referred to as a second emission control transistor. The seventh transistor T7 may be turned on in case that the emission signal EM is provided to the emission line ESLi, and may electrically connect the second electrode of the first transistor T1 and the second power line VSL.

In an embodiment, it is illustrated that the sixth transistor T6 and the seventh transistor T7 are connected to the same emission line ESLi and turned on through the same emission signal EM, but this is an example, and the sixth transistor T6 and the seventh transistor T7 may also be turned on independently of each other in response to different signals that are distinct from each other. For example, in the pixel driver PDC according to an embodiment, any one among the sixth transistor T6 and the seventh transistor T7 may also be omitted.

The eighth transistor T8 may be connected between a second initialization voltage line VIL2 and the fourth node N4. For example, the eighth transistor T8 may include a gate connected to an i-th fourth scan line GBLi (hereinafter, second initialization scan line), a first electrode connected to the second initialization voltage line VIL2, and a second electrode connected to the fourth node N4. The eighth transistor T8 may be referred to as a second initialization transistor. The eighth transistor T8 may provide a second initialization voltage VINT2 to the fourth node N4 corresponding to the cathode of the light-emitting element LD in response to a second initialization scan signal GB transmitted through the second initialization scan line GBLi. The cathode of the light-emitting element LD may be initialized by the second initialization voltage VINT2.

In an embodiment, some of the second to eighth transistors T2, T3, T4, T5, T6, T7, and T8 may be simultaneously turned on through the same scan signal. For example, the eighth transistor T8 and the fifth transistor T5 may be simultaneously turned on through the same scan signal. For example, the eighth transistor T8 and the fifth transistor T5 may operate in response to the same compensation scan signal GC. The eighth transistor T8 and the fifth transistor T5 may be simultaneously turned on/off by the same compensation scan signal GC. For example, the compensation scan line GCLi and the second initialization scan line GBLi may also be provided substantially as a single scan line. Accordingly, initialization of the cathode of the light-emitting element LD and compensation of the threshold voltage of the first transistor T1 may be performed at the same timing. However, this is an example, and is not limited to any one embodiment.

For example, according to an embodiment, the cathode initialization of the light-emitting element LD and the threshold voltage compensation of the first transistor T1 may be performed by applying the same power voltage. For example, the compensation voltage line VCL and the second initialization voltage line VIL2 may be provided substantially as a single power voltage line. For example, the cathode initialization operation and the compensation operation of the driving transistor may be performed with a power voltage (e.g., single power voltage), so that the design of the driver may be simplified. However, this is an example, and is not limited to any one embodiment.

The first capacitor C1 may be disposed between the first node N1 and the third node N3. The first capacitor C1 may store a differential voltage between the first node N1 and the third node N3. The first capacitor C1 may be referred to as a storage capacitor.

The second capacitor C2 may be disposed between the third node N3 and the second power line VSL. For example, an electrode of the second capacitor C2 may be connected to the second power line VSL that receives the second power voltage VSS, and another electrode of the second capacitor C2 may be connected to the third node N3. The second capacitor C2 may store charges corresponding to voltage difference between the second power voltage VSS and the third node N3. The second capacitor C2 may be referred to as a hold capacitor. The second capacitor C2 may have higher storage capacity than that of the first capacitor C1.

Accordingly, the second capacitor C2 may minimize the voltage change of the third node N3 in response to the voltage change of the first node N1.

In an embodiment, the light-emitting element LD may be connected to the pixel driver PDC through the fourth node N4. The light-emitting element LD may include an anode connected to the first power line VDL and a cathode opposed to the anode. In an embodiment, the light-emitting element LD may be connected to the pixel driver PDC through the cathode. For example, in the pixel PXij according to an embodiment, a connection node where the light-emitting element LD and the pixel driver PDC are connected may be the fourth node N4, and the fourth node N4 may correspond to a connection node between the first electrode of the sixth transistor T6 and the cathode of the light-emitting element LD. Accordingly, the potential of the fourth node N4 may substantially correspond to the potential of the cathode of the light-emitting element LD.

For example, the anode of the light-emitting element LD may be connected to the first power line VDL, so that the first power voltage VDD, which is a constant voltage, may be applied thereto, and the cathode may be connected to the first transistor T1 through the sixth transistor T6. For example, in an embodiment where the first to eighth transistors T1 to T8 are N-type transistors, the potential of the third node N3, corresponding to a source of the first transistor T1 that is a driving transistor, may not be directly affected by characteristics of the light-emitting element LD. Therefore, even though deterioration occurs in the light-emitting element LD, the effect on a gate-source voltage Vgs of the transistors constituting the pixel driver PDC, such as the gate-source voltage Vgs of the driving transistor, may be reduced. For example, since the amount of change in a driving current, due to the deterioration of the light-emitting element LD, may be decreased, afterimage defects on the display panel, caused by increase in usage hours, may be reduced, and the lifespan may be improved.

In another example, as illustrated in FIG. 2B, a pixel PXij-1 may also include a pixel driver PDC-1 having two transistors T1 and T2 and one first capacitor C1. The pixel driver PDC-1 may be connected to a light-emitting element LD, a write scan line GWLi, a data line DLj, and a second power line VSL. The pixel driver PDC illustrated in FIG. 2B may correspond to the pixel driver PDC, illustrated in FIG. 2A, where the third to eighth transistors T3 to T8 and the second capacitor C2 are omitted.

First and second transistors T1 and T2 may each be an N-type transistor or a P-type transistor. In an embodiment, each of the first and second transistors T1 and T2 is described as the N-type transistor.

The first transistor T1 may include a gate connected to a first node N1, a first electrode connected to a second node N2, and a second electrode connected to a third node N3. The second node N2 may be a node connected to a first power line VDL through the light-emitting element LD, and the third node N3 may be a node connected to a second power line VSL. The first transistor T1 may be connected to the light-emitting element LD through the second node N2, and connected to the second power line VSL through the third node N3. The first transistor T1 may be a driving transistor.

The second transistor T2 may include a gate that receives a write scan signal GW through the write scan line GWLi, a first electrode connected to the data line DLj, and a second electrode connected to the first node N1. The second transistor T2 may provide a data signal DATA to the first node N1 in response to the write scan signal GW transmitted through the write scan line GWLi.

The first capacitor C1 may include an electrode connected to the first node N1 and another electrode connected to the third node N3. The first capacitor C1 may store the data signal DATA transmitted to the first node N1.

The light-emitting element LD may include an anode and a cathode. In an embodiment, the anode of the light-emitting element LD may be connected to the first power line VDL, and the cathode may be connected to the pixel driver PDC-1 through the second node N2. In an embodiment, the cathode of the light-emitting element LD may be connected to the first transistor T1. The light-emitting element LD may emit light in correspondence to the amount of current flowing through the first transistor T1 of the pixel driver PDC-1.

In an embodiment where the first and second transistors T1 and T2 are N-type transistors, the second node N2, where the cathode of the light-emitting element LD and the pixel driver PDC-1 are connected, may correspond to a drain of the first transistor T1. For example, the change in a gate-source voltage Vgs of the first transistor T1, due to the light-emitting element LD, may be prevented. Accordingly, since the amount of change in a driving current, due to deterioration of the light-emitting element LD, may be decreased, afterimage defects on the display panel, caused by increase in usage hours, may be reduced, and the lifespan may be improved.

In another example, as illustrated in FIG. 2C, the pixel PXij-2 may also include a pixel driver PDC-2 having six transistors T1, T2, T3, T4a, T5a, and T6a, and two capacitors C1 and C2.

The pixel driver PDC-2 may be connected to a light-emitting element LD, a write scan line GWLi, a reset scan line GRLi, a compensation scan line GCLi, an i-th first emission line ESL1i (hereinafter, first emission line), an i-th second emission line ESL2i (hereinafter, second emission line), a data line DLj, a first power line VDL, a second power line VSL, a third power line VRL, and an initialization voltage line VIL.

The pixel driver PDC-2, illustrated in FIG. 2C, may be similar with the pixel driver PDC, illustrated in FIG. 2A, where the fourth transistor T4 and the fifth transistor T5 are omitted. Since the area of the pixel driver PDC-2 illustrated in FIG. 2C is smaller than the area of the pixel driver PDC illustrated in FIG. 2A, high resolution may be achieved more readily.

The first to sixth transistors T1, T2, T3, T4a, T5a, and T6a may each be an N-type transistor or a P-type transistor. In an embodiment, each of the first to sixth transistors T1, T2, T3, T4a, T5a, and T6a is described as the N-type transistor.

The first transistor T1 may include a gate connected to a first node N1, a first electrode connected to a second node N2, and a second electrode connected to a third node N3. The second node N2 may be a node connected to the first power line VDL through the light-emitting element LD, and the third node N3 may be a node connected to the second power line VSL. The first transistor T1 may be connected to the light-emitting element LD through the second node N2, and connected to the second power line VSL through the third node N3. The first transistor T1 may be a driving transistor.

The second transistor T2 may include a gate that receives a write scan signal GW through the write scan line GWLi, a first electrode connected to the data line DLj, and a second electrode connected to the first node N1. The second transistor T2 may provide a data signal DATA to the first node N1 in response to the write scan signal GW transmitted through the write scan line GWLi.

The third transistor T3 may be connected between the first node N1 and the reference voltage line VRL. A first electrode of the third transistor T3 may receive a reference voltage VREF through the reference voltage line VRL, and a second electrode of the third transistor T3 may be connected to the first node N1. In an embodiment, a gate of the third transistor T3 may receive a reset scan signal GR through the reset scan line GRLi. The third transistor T3 may be turned on in case that the reset scan signal GR is provided to the reset scan line GRLi, and provide the reference voltage VREF to the first node N1.

The fourth transistor T4a may be connected between the first transistor T1 and the light-emitting element LD. For example, a gate of the fourth transistor T4a may receive a first emission signal EM1 through the first emission line ESL1i. A first electrode of the fourth transistor T4a may be connected to a cathode of the light-emitting element LD through a fourth node N4, and a second electrode of the fourth transistor T4a may be connected to the first electrode of the first transistor T1 through the second node N2. The fourth transistor T4a may be referred to as a first emission control transistor. The fourth transistor T4a may be turned on in case that the first emission signal EM1 is provided to the first emission line ESL1i, and may electrically connect the light-emitting element LD and the first transistor T1.

The fifth transistor T5a may be connected between the second power line VSL and the third node N3. A first electrode of the fifth transistor T5a may be connected to the second electrode of the first transistor T1 through the third node N3, and a second electrode of the fifth transistor T5a may receive a second power voltage VSS through the second power line VSL. A gate of the fifth transistor T5a may be electrically connected to the second emission line ESL2i. The fifth transistor T5a may be referred to as a second emission control transistor. The fifth transistor T5a may be turned on in case that a second emission signal EM2 is provided to the second emission line ESL2i, and electrically connects the second electrode of the first transistor T1 and the second power line VSL.

In an embodiment, the fourth transistor T4a and the fifth transistor T5a may be connected to the first and second emission lines ESL1i and ESL2i that are distinct from each other, and may thus be turned on through the first and second emission signals EM1 and EM2 that are distinct from each other. For example, the fourth transistor T4a and the fifth transistor T5a may be turned on independently of each other. However, this is an example, and embodiments are not limited thereto. For example, according to an embodiment, the fourth transistor T4a and the fifth transistor T5a may be connected to the same emission line, and controlled by the same emission signal. For example, in the pixel driver PDC-2 according to an embodiment, any one among the fourth transistor T4a and the fifth transistor T5a may also be omitted.

The sixth transistor Toa may be connected between the initialization voltage line VIL and the fourth node N4. For example, the sixth transistor Toa may include a gate connected to the compensation scan line GCLi, a first electrode connected to the initialization voltage line VIL, and a second electrode connected to the fourth node N4. The sixth transistor Toa may be referred to as an initialization transistor. The sixth transistor Toa may provide an initialization voltage VINT to the fourth node N4 corresponding to a cathode of the light-emitting element LD in response to a compensation scan signal GC transmitted through the compensation scan line GCLi. The cathode of the light-emitting element LD may be initialized by the initialization voltage VINT.

A first capacitor C1 may be disposed between the first node N1 and the third node N3. The first capacitor C1 may store a differential voltage between the first node N1 and the third node N3. The first capacitor C1 may be referred to as a storage capacitor.

A second capacitor C2 may be disposed between the third node N3 and the second power line VSL. For example, an electrode of the second capacitor C2 may be connected to the second power line VSL that receives the second power voltage VSS, and another electrode of the second capacitor C2 may be connected to the third node N3. The second capacitor C2 may store charges corresponding to voltage difference between the second power voltage VSS and the third node N3. The second capacitor C2 may be referred to as a hold capacitor.

The light-emitting element LD may include an anode and a cathode. In an embodiment, the anode of the light-emitting element LD may be connected to the first power line VDL, and the cathode may be connected to the pixel driver PDC-2 through the fourth node N4. In an embodiment, the cathode of the light-emitting element LD may be connected to the first transistor T1 through the fourth transistor T4a. The light-emitting element LD may emit light in correspondence to the amount of current flowing through the first transistor T1 of the pixel driver PDC-2.

In an embodiment where the first to sixth transistors T1, T2, T3, T4a, T5a, and T6a are N-type transistors, the potential of the third node N3 corresponding to a source of the first transistor T1, which is a driving transistor, may not be directly affected by characteristics of the light-emitting element LD. Therefore, even though deterioration occurs in the light-emitting element LD, effect on a gate-source voltage Vgs of the transistors constituting the pixel driver PDC-2, e.g., a gate-source voltage Vgs of the driving transistor, may be reduced. For example, since the amount of change in a driving current, due to the deterioration of the light-emitting element LD, may be decreased, afterimage defects on the display panel, caused by increase in usage hours, may be reduced and the lifespan may be improved.

FIGS. 2A, 2B, and 2C illustrate the circuits for the pixel drivers PDC, PDC-1, and PDC-2 according to an embodiment, and in the display panel according to an embodiment, the number of transistors or arrangement relationship thereof and the number of capacitors or arrangement relationship thereof may be variously designed as long as the circuit is connected to the cathode of the light-emitting element LD, and the circuit is not limited to any one embodiment.

Figure 3A:
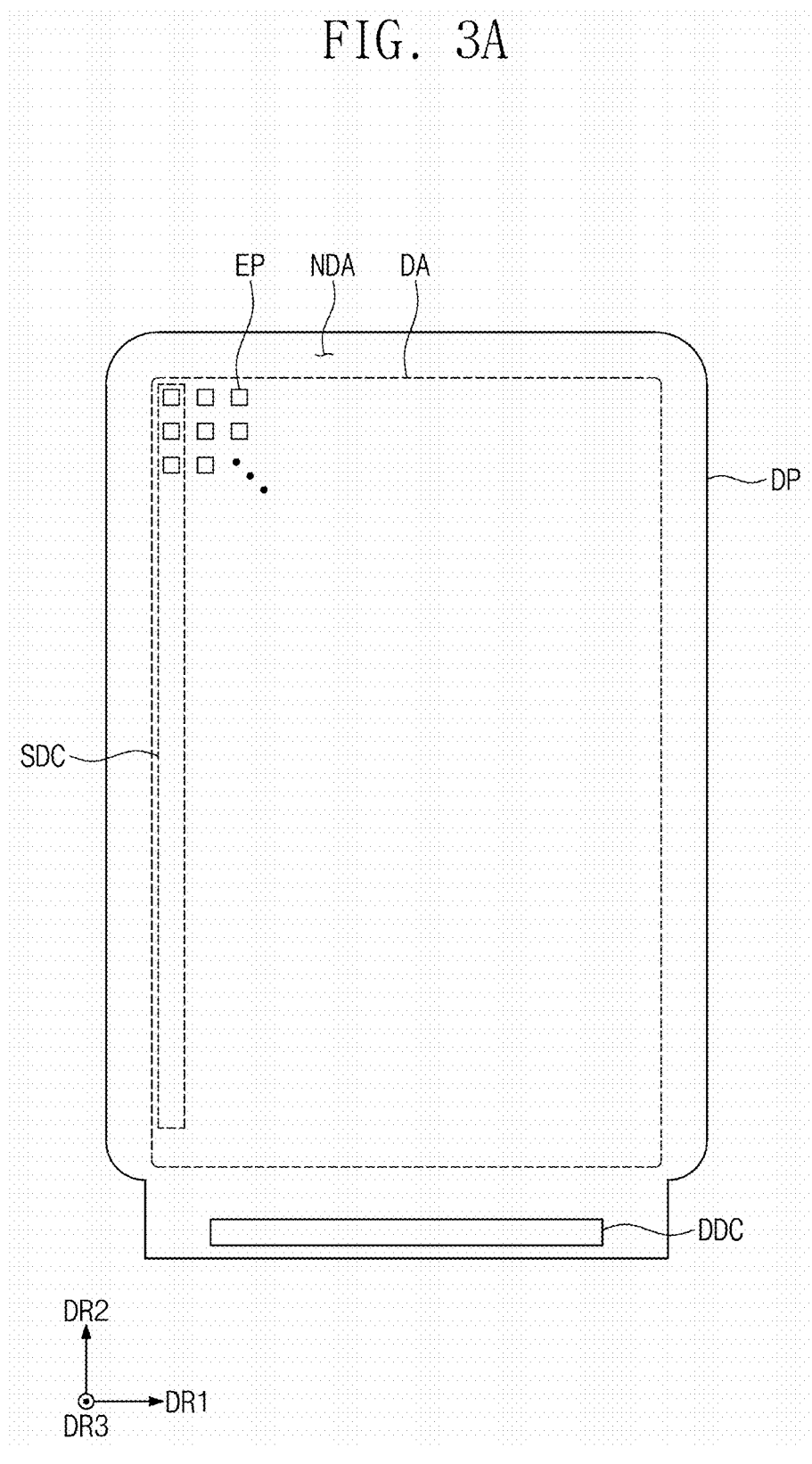
FIG. 3A is a schematic plan view schematically illustrating a display panel according to an embodiment.
Figure 3B:
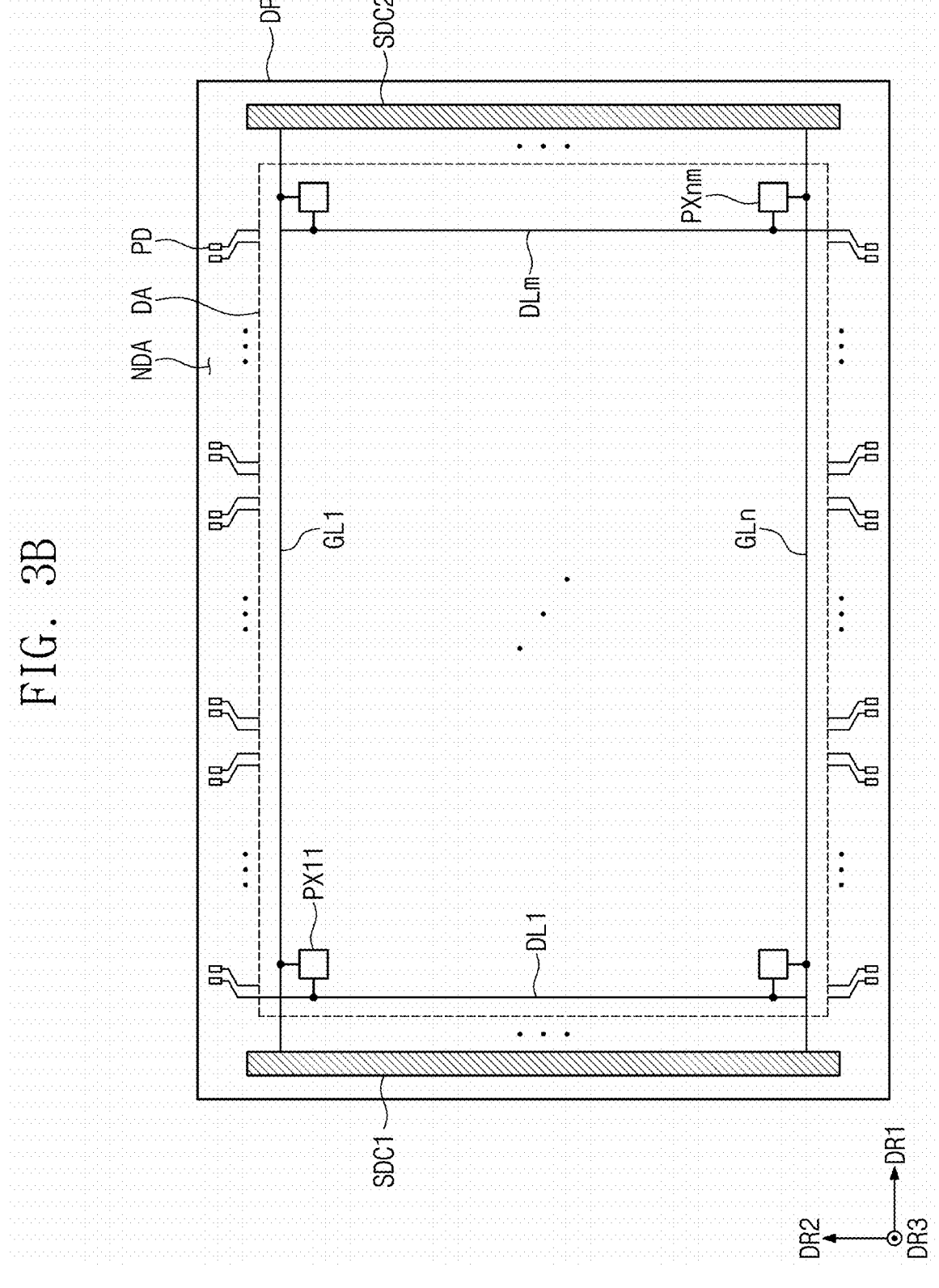
FIG. 3B is a schematic plan view schematically illustrating a display panel according to an embodiment.

FIGS. 3A and 3B are schematic plan views schematically illustrating a display panel according to an embodiment. Each of FIGS. 3A and 3B illustrates the schematic plan view with some components being omitted. Hereinafter, an embodiment is described with reference to FIGS. 3A and 3B.

Referring to FIG. 3A, a display panel DP according to an embodiment may be divided into a display region DA and a peripheral region (or non-display region NDA). The display region DA may include light-emitting parts EP.

The light-emitting parts EP may be regions where light is emitted respectively by the pixels PXij (see FIG. 1). For example, the light-emitting parts EP may each correspond to a light-emitting opening OP-PDL (see FIG. 5) to be described later. The light-emitting opening OP-PDL may be referred to as an opening or an opening part.

The peripheral region NDA may be disposed adjacent to the display region DA. In an embodiment, the peripheral region NDA is illustrated in a shape surrounding an edge portion of the display region DA. However, this is an example, and the peripheral region NDA may be disposed on a side of the display region DA, or may also be omitted, and is not limited to any one embodiment.

In an embodiment, a scan driver SDC and a data driver DDC may be mounted on the display panel DP. In an embodiment, the scan driver SDC may be disposed in the display region DA, and the data driver DDC may be disposed in the peripheral region NDA. The scan driver SDC may overlap at least some of light-emitting parts EP disposed in the display region DA on a plane (or in a plan view). Since the scan driver SDC is disposed in the display region DA, the area of the peripheral region NDA may be more reduced than that of a typical display panel where the scan driver is disposed in the peripheral region, and a display device with a thin bezel may be readily achieved.

For example, unlike what is illustrated in FIG. 3A, the scan driver SDC may also be provided in two portions that are distinct from each other. The two scan drivers SDC may be disposed apart from each other on the left and right with the center of the display region DA therebetween. In another example, the scan driver SDC may also be provided in about 2 or more numbers, and is not limited to any one embodiment.

FIG. 3A illustrates an example of the display panel, and the data driver DDC may also be disposed in the display region DA. For example, some of the light-emitting parts EP, disposed in the display region DA, may overlap the data driver DDC on a plane (or in a plan view).

In an embodiment, the data driver DDC may be provided as a separate driving chip independently of the display panel DP, and connected to the display panel DP. However, this is an example, the data driver DDC and the scan driver SDC may also be formed in the same process to form the display panel DP, and the composition is not limited to any one embodiment.

As illustrated in FIG. 3B, a display panel DP may also have a shape where the length corresponding to a first direction DR1 is greater than the length corresponding to a second direction DR2. It is illustrated that in a display region DA, pixels PX11 to PXnm are arranged in n rows and m columns. In an embodiment, the display panel DP may include scan drivers SDC1 and SDC2. It is illustrated that the scan drivers SDC1 and SDC2 include a first scan driver SDC1 and a second scan driver SDC2 spaced apart from each other in the first direction DR1.

The first scan driver SDC1 may be connected to some of scan lines GL1 to GLn, and the second scan driver SDC2 may be connected to the others of the scan lines GL1 to GLn. For example, the first scan driver SDC1 may be connected to odd-numbered scan lines among the scan lines GL1 to GLn, and the second scan driver SDC2 may be connected to even-numbered scan lines among the scan lines GL1 to GLn.

For the convenience of description, FIG. 3B illustrates pads PD of data lines DL1 to DLm. The pads PD may be defined at end portions of the data lines DL1 to DLm. The data lines DL1 to DLm may be connected to the data driver DDC (see FIG. 3A) through the pads PD.

According to an embodiment, the pads PD may be divided to be arranged at positions of a peripheral region NDA spaced apart from each other with the display region DA therebetween. For example, some of the pads PD may be disposed on an upper side, which is a side adjacent to the first scan line GL1 among the scan lines GL1 to GLn, and the others of the pads PD may be disposed on a lower side, which is a side adjacent to the last scan line GLn among the scan lines GL1 to GLn. In an embodiment, pads PD connected to odd-numbered data lines among the data lines DL1 to DLm may be disposed on the upper side, and pads PD connected to even-numbered data lines among the data lines DL1 to DLm may be disposed on the lower side.

For example, the display panel DP may include upper-side data drivers connected to the pads PD disposed on the upper side, and/or lower-side data drivers connected to the pads PD disposed on the lower side. However, this is an example, and the display panel DP may also include an upper-side data driver connected to the pads PD disposed on the upper side, and/or a lower-side data driver connected to the pads PD disposed on the lower side. The pads PD according to an embodiment may also be disposed only one side of the display panel DP to be connected to a single data driver, and the composition is not limited to any one embodiment.

For example, as illustrated in FIG. 3A, the display panel DP in FIG. 3B may also have the scan driver and/or the data driver disposed in the display region DA, and accordingly, some of the light-emitting parts EP disposed in the display region DA may overlap the scan driver and/or the data driver on a plane (or in a plan view).

FIGS. 4A to 4D are enlarged schematic plan views illustrating a partial region of a display panel according to an embodiment.

Figure 4A:
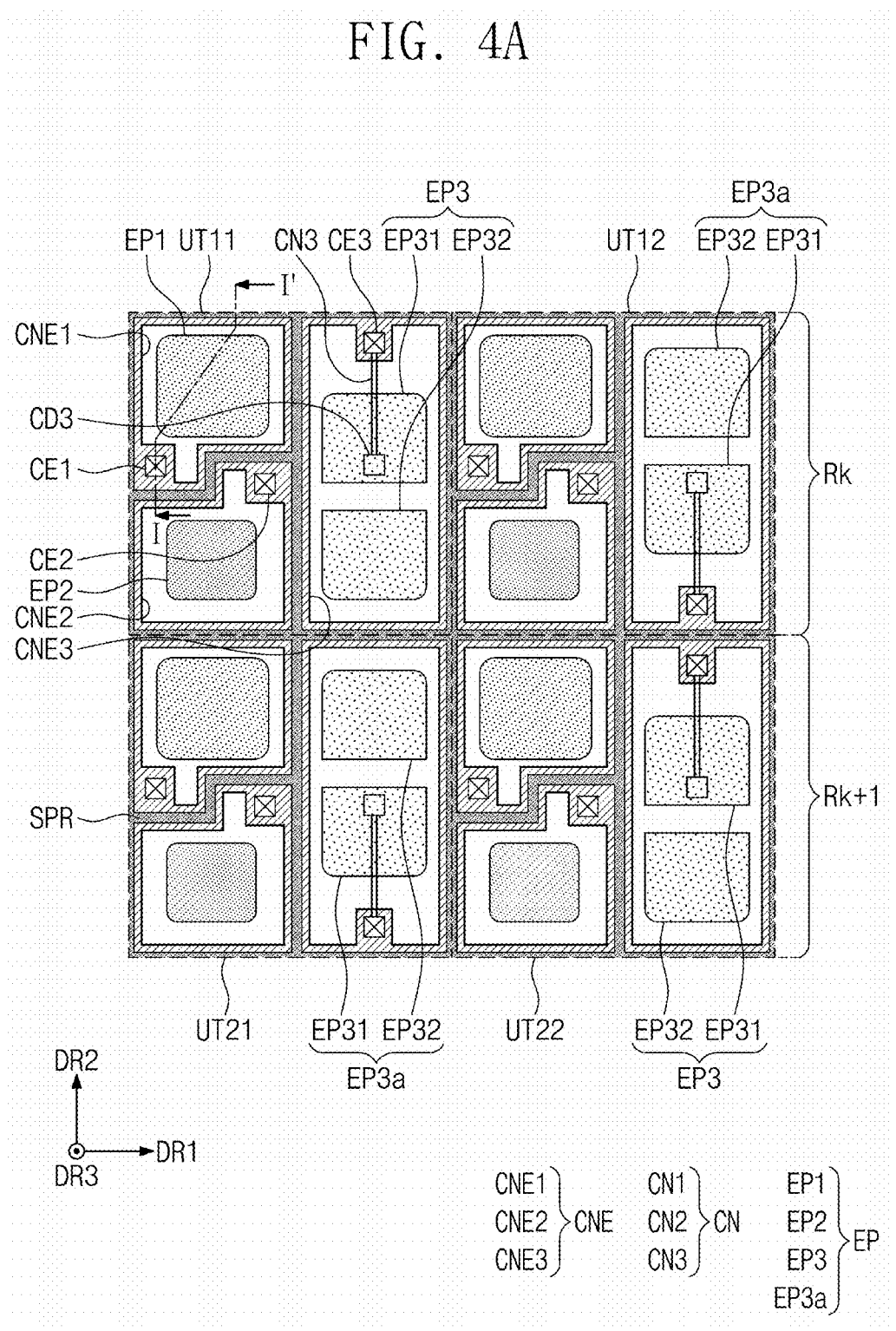
FIG. 4A is an enlarged schematic plan view illustrating a partial region of a display panel according to an embodiment.

FIG. 4A illustrates two rows and two columns of light-emitting units UT11, UT12, UT21, and UT22. Referring to FIG. 4A, light-emitting parts EP in a first row Rk include light-emitting parts EP constituting a first-row first-column light-emitting unit UT11 and a first-row second-column light-emitting unit UT12, and light-emitting parts EP in a second row Rk+1 include light-emitting parts EP constituting a second-row first-column light-emitting unit UT21 and a second-row second-column light-emitting unit UT22.

The light-emitting parts EP (e.g., EP1, EP2, and EP3) may each correspond to a light-emitting opening OP-PDL (see FIG. 5) to be described later. For example, the light-emitting parts EP1, EP2, and EP3 may each be a region where light is emitted by the light-emitting element LD previously described. The light-emitting parts EP1, EP2, and EP3 may correspond to a unit which generates an image displayed in the display panel DP (see FIG. 1). For example, the light-emitting parts EP1, EP2, and EP3 may each correspond to a region defined by the light-emitting opening OP-PDL to be described later, e.g., a region defined by a lower surface of the light-emitting opening OP-PDL.

The light-emitting parts EP1, EP2, and EP3 may include a first light-emitting part EP1, a second light-emitting part EP2, and a third light-emitting part EP3. The first light-emitting part EP1, the second light-emitting part EP2, and the third light-emitting part EP3 may emit light of different colors. For example, the first light-emitting part EP1 may emit red color light, the second light-emitting part EP2 may emit green color light, and the third light-emitting part EP3 may emit blue color light, but the combination of colors is not limited thereto. For example, at least two among the first to third light-emitting parts EP1, EP2, and EP3 may emit light of the same color. For example, all of the first to third light-emitting parts EP1, EP2, and EP3 may emit the blue color light, or all may also emit white color light.

The third light-emitting part EP3, among the first to third light-emitting parts EP1, EP2, and EP3, displaying light emitted by a third light-emitting element LD3 may include two sub-light-emitting parts EP31 and EP32 spaced apart from each other in a second direction DR2. However, this is an example, the third light-emitting part EP3 may also be provided in a pattern having an integrated shape like the first and second light-emitting parts EP1 and EP2, at least any one of the first or second light-emitting part EP1 or EP2 may also include sub-light-emitting parts spaced apart from each other, and the composition is not limited to any one embodiment.

The light-emitting parts EP in the first row Rk may include the first to third light-emitting parts EP1, EP2, and EP3 constituting the first-row first-column light-emitting unit UT11 and the first to third light-emitting parts EP1, EP2, and EP3a constituting the first-row second-column light-emitting unit UT12, and the light-emitting parts EP in the second row Rk+1 may include the first to third light-emitting parts EP1, EP2, and EP3a constituting the second-row first-column light-emitting unit UT21 and the first to third light-emitting parts EP1, EP2, and EP3 constituting the second-row second-column light-emitting unit UT22.

According to an embodiment, the light-emitting parts EP constituting the first-row first-column light-emitting unit UT11 and the light-emitting parts EP constituting the second-row second-column light-emitting unit UT22 may have substantially the same shape. For example, the light-emitting parts EP constituting the first-row second-column light-emitting unit UT12 and the light-emitting parts EP constituting the second-row first-column light-emitting unit UT21 may have substantially the same shape. The shape of the light-emitting parts EP constituting the first-row first-column light-emitting unit UT11 may be different from the shape of the light-emitting parts EP constituting the first-row second-column light-emitting unit UT12. For example, some of the light-emitting parts EP in the first row Rk and some of the light-emitting parts EP in the second row Rk+1 may have the symmetrical shape.

According to an embodiment, the third light-emitting part EP3a of the second-row first-column light-emitting unit UT21 and the third light-emitting part EP3 of the first-row first-column light-emitting unit UT11 may have a shape and arrangement form symmetrical with respect to an axis parallel to a first direction DR1, and the third light-emitting part EP3 of the second-row second-column light-emitting unit UT22 and the third light-emitting part EP3a of the first-row second-column light-emitting unit UT12 may have a shape and arrangement form symmetrical with respect to an axis parallel to the first direction DR1. However, this is an example, and embodiments are not limited thereto.

Figure 4B:
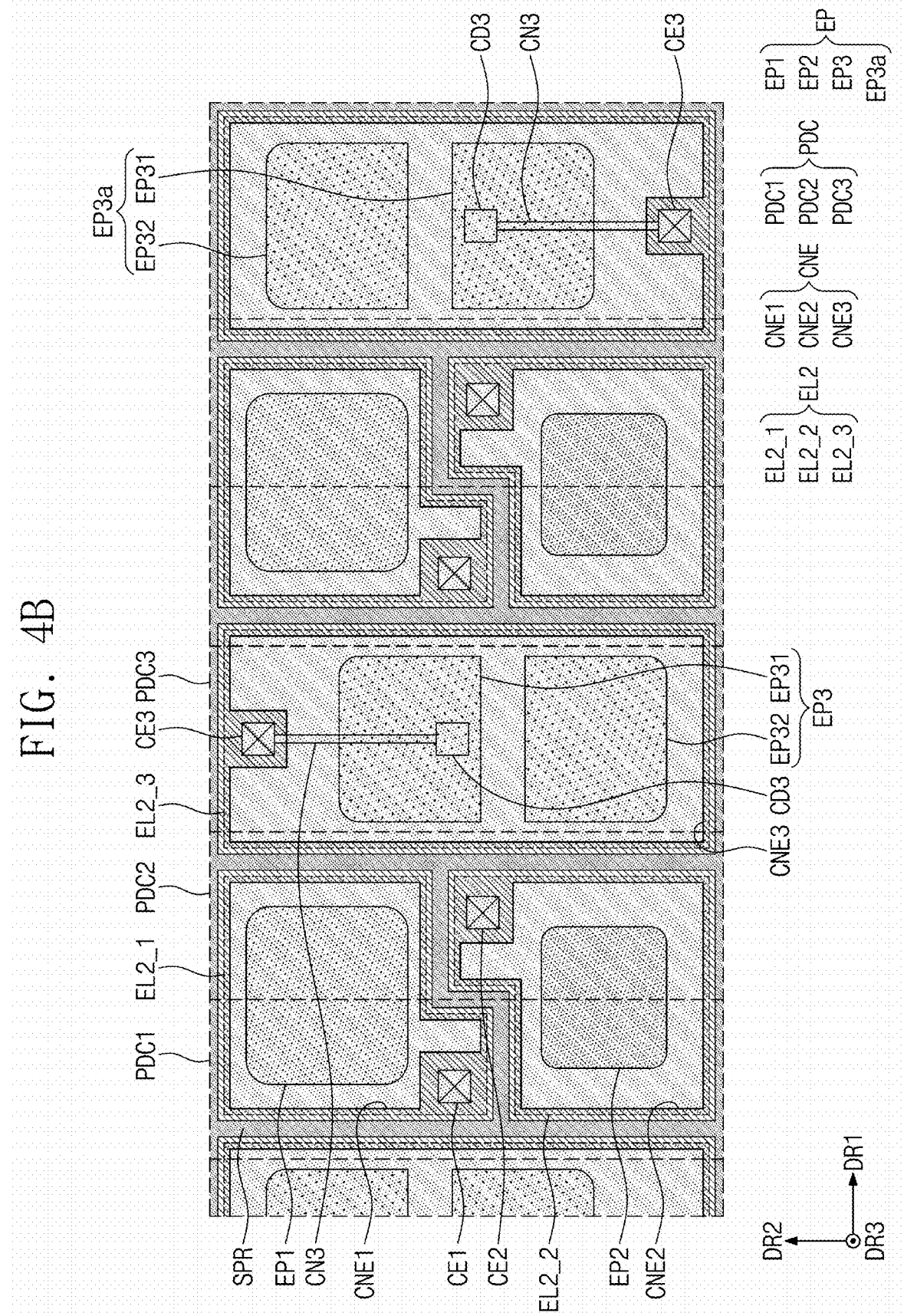
FIG. 4B is an enlarged schematic plan view illustrating a partial region of a display panel according to an embodiment.
Figure 4C:
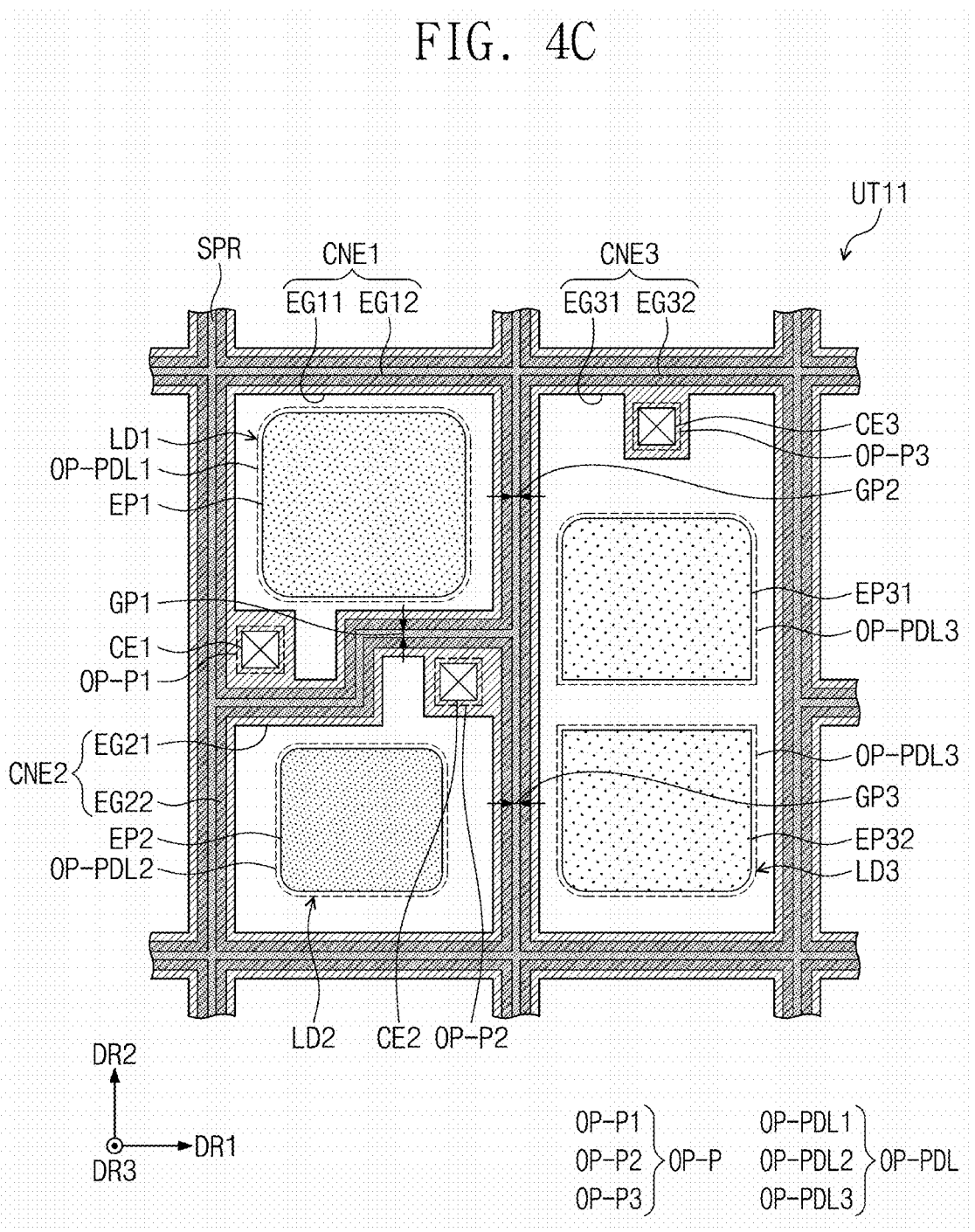
FIG. 4C is an enlarged schematic plan view illustrating a partial region of a display panel according to an embodiment.

FIG. 4B illustrates light-emitting parts arranged in a single row. For the convenience of description, FIG. 4B illustrates second electrodes EL2 (e.g., EL2_1, EL2_2, and EL2_3), pixel drivers PDC (e.g., PDC1, PDC2, and PDC3), first to third connection electrodes CNE (e.g., CNE1, CNE2, and CNE3), and a separator SPR. FIG. 4C illustrates, among components of the display panel DP, a separator SPR, light-emitting parts EP1, EP2, and EP3 disposed in a region divided by the separator SPR, and connection electrodes CNE1, CNE2, and CNE3.

Referring to FIGS. 4B and 4C, the second electrodes EL2_1, EL2_2, and EL2_3 may be separated by the separator SPR and may thus be electrically disconnected from each other. In an embodiment, a single light-emitting unit UT11 may include three light-emitting parts EP1, EP2, and EP3. Accordingly, the light-emitting unit UT11 may include three second electrodes EL2_1, EL2_2, and EL2_3 (hereinafter, first to third cathodes), three pixel drivers PDC1, PDC2, and PDC3, and three connection electrodes CNE1, CNE2, and CNE3. However, this is an example, and the number and the arrangement of the light-emitting parts EP included in the light-emitting unit UT11 may be variously designed, and are not limited to any one embodiment.

The first to third pixel drivers PDC1, PDC2, and PDC3 may be electrically connected to first to third light-emitting elements LD1, LD2, and LD3 including the first to third light-emitting parts EP1, EP2, and EP3, respectively. In the description, the meaning of "to be connected" includes not only the case of being physically connected by direct contact but also the case of being electrically connected.

For example, as illustrated in FIG. 4B, respective regions where the first to third pixel drivers PDC1, PDC2, and PDC3 are defined on a plane (or in a plan view) may correspond to units where transistor and capacitor elements, constituting the pixel driver PDC (see FIG. 2A) for driving the light-emitting element LD of a pixel, are repeatedly arranged.

The first to third pixel drivers PDC1, PDC2, and PDC3 may be disposed along a first direction DR1 in sequence. For example, the positions where the first to third pixel drivers PDC1, PDC2, and PDC3 are disposed may be independently designed regardless of the positions or shapes of the first to third light-emitting parts EP1, EP2, and EP3.

For example, the first to third pixel drivers PDC1, PDC2, and PDC3 may be disposed at different positions from regions defined by being divided by the separator SPR, e.g., the positions where the first to third cathodes EL2_1, EL2_2, and EL2_3 are disposed, or may be designed to have different shapes and areas from those of the first to third cathodes EL2_1, EL2_2, and EL2_3. In another example, the first to third pixel drivers PDC1, PDC2, and PDC3 may respectively overlap positions where the first to third light-emitting parts EP1, EP2, and EP3 are disposed, and may also be designed to have the areas of similar forms with those of the regions defined by being divided by the separator SPR, for example, the first to third cathodes EL2_1, EL2_2, and EL2_3.

In an embodiment, each of the first to third pixel drivers PDC1, PDC2, and PDC3 is illustrated in a rectangular shape, and each of the first to third light-emitting parts EP1, EP2, and EP3 is arranged in a smaller area than that of the shape and in a different form therefrom. The first to third cathodes EL2_1, EL2_2, and EL2_3 are disposed at positions overlapping the first to third light-emitting parts EP1, EP2, and EP3, but are illustrated in an irregular shape.

Accordingly, as illustrated in FIG. 4B, the first pixel driver PDC1 may be disposed at a position overlapping the first light-emitting part EP1, the second light-emitting part EP2, and also partially overlapping another light-emitting unit adjacent thereto. The second pixel driver PDC2 may be disposed at a position overlapping the first light-emitting part EP1, the second light-emitting part EP2, and the third cathode EL2_3. The third pixel driver PDC3 may be disposed at a position overlapping the third light-emitting part EP3. This is an example, and the positions of the first to third pixel drivers PDC1, PDC2, and PDC3 may be designed in various shapes and arrangement independently of the first to third light-emitting parts EP1, EP2, and EP3, and are not limited to any one embodiment.

The light-emitting unit UT11 may include the first to third connection electrodes CNE1, CNE2, and CNE3. The first connection electrode CNE1 may electrically connect the first light-emitting element LD1, which forms the first light-emitting part EP1 (or where the first light-emitting part EP1 is defined), and the first pixel driver PDC1. The second connection electrode CNE2 may electrically connect the second light-emitting element LD2, which forms the second light-emitting part EP2, and the second pixel driver PDC2. The third connection electrode CNE3 may electrically connect the third light-emitting element LD3, which forms the third light-emitting part EP3, and the third pixel driver PDC3.

For example, the first to third connection electrodes CNE1, CNE2, and CNE3 may electrically connect the first to third cathodes EL2_1, EL2_2, and EL2_3 and the first to third pixel drivers PDC1, PDC2, and PDC3 in a one-to-one correspondence.

The first to third connection electrodes CNE1, CNE2, and CNE3 may each be disposed on a pixel-defining layer PDL (see FIG. 5) to be described later. The first to third connection electrodes CNE1, CNE2, and CNE3 may have ring shapes surrounding the corresponding first to third light-emitting parts EP1, EP2, and EP3. According to an embodiment, it is illustrated that each of the first to third connection electrodes CNE1, CNE2, and CNE3 has a closed-line ring shape, but embodiments are not limited thereto. For example, at least some among the first to third connection electrodes CNE1, CNE2, and CNE3 may have an open ring shape, of which a portion is disconnected.

Since the first to third connection electrodes CNE1, CNE2, and CNE3 have the ring shape, the degree of freedom of the positions where the first to third connection electrodes CNE1, CNE2, and CNE3 and the first to third pixel drivers PDC1, PDC2, and PDC3 are connected may be improved. For example, the first connection electrode CNE1 may be connected to the first pixel driver PDC1 through a first contact part CE1, the second connection electrode CNE2 may be connected to the second pixel driver PDC2 through a second contact part CE2, and the third connection electrode CNE3 may be connected to the third pixel driver PDC3 through a connection line CN3. For example, connection lines to be additionally connected to the first to second connection electrodes CNE1 and CNE2 may be omitted.

A connection line CN3 may electrically connect the third pixel driver PDC3 and the third light-emitting element LD3 constituting the third light-emitting part EP3. For example, the connection line CN3 may correspond to a node (e.g., the fourth node N4 in FIG. 2A, second node N2 in FIG. 2B, or fourth node N4 in FIG. 2C) where the light-emitting element LD (see FIG. 2A) is connected to the pixel driver PDC in FIG. 2A, PDC-1 in FIG. 2B, or PDC-2 in FIG. 2C.

The connection line CN3 may include a third contact part CE3 and a driving contact part CD3. The third contact part CE3 may be formed (or provided) onto a side of the connection line CN3, and the driving contact part CD3 may be formed (or provided) onto another side of the connection line CN3.

The driving contact part CD3 may be a portion of the connection line CN3 connected to the pixel driver PDC3. In an embodiment, the driving contact part CD3 may be connected to an electrode of a transistor constituting the pixel driver PDC3. For example, the driving contact part CD3 may be connected to a drain of the sixth transistor T6 illustrated in FIG. 2A, a drain of the first transistor T1 illustrated in FIG. 2B, or a drain of the fourth transistor T4a illustrated in FIG. 2C. Accordingly, the position of the driving contact part CD3 may correspond to the position of the transistor physically connected to the connection line CN3 in the pixel driver PDC. The third contact part CE3 may be a portion of the connection line CN3 connected to the third light-emitting element LD3. In an embodiment, the third contact part CE3 may be connected to the third connection electrode CNE3.

The first connection electrode CNE1 may include a first edge portion EG11 surrounding at least a portion of the first light-emitting part EP1 and a second edge portion EG12 surrounding the first edge portion EG11. The second connection electrode CNE2 may include a first edge portion EG21 surrounding at least a portion of the second light-emitting part EP2 and a second edge portion EG22 surrounding the first edge portion EG21. The third connection electrode CNE3 may include a first edge portion EG31 surrounding at least a portion of the third light-emitting part EP3 and a second edge portion EG32 surrounding the first edge portion EG31.

The first to third connection electrodes CNE1, CNE2, and CNE3 may be spaced apart from each other. For example, gaps GP1, GP2, and GP3 between connection electrodes adjacent to each other, among the first to third connection electrodes CNE1, CNE2, and CNE3, may overlap the separator SPR. For example, the first edge portions EG11, EG21, and EG31 of the first to third connection electrodes CNE1, CNE2, and CNE3 may not be covered by the separator SPR, and the second edge portions EG12, EG22, and EG32 of the first to third connection electrodes CNE1, CNE2, and CNE3 may overlap the separator SPR. In another example, the second edge portions EG12, EG22, and EG32 of the first to third connection electrodes CNE1, CNE2, and CNE3 may be covered by the separator SPR.

According to an embodiment, the first to third contact parts CE1, CE2, and CE3 may be disposed at positions not overlapping the first to third light-emitting parts EP1, EP2, and EP3 on a plane (or in a plan view). For example, a light-emitting opening OP-PDL (see FIG. 5) and through-holes OP-P (see FIG. 5) spaced apart from the light-emitting opening OP-PDL may be formed (or defined) in the pixel-defining layer PDL.

The through-holes OP-P may include a first through-hole OP-P1, a second through-hole OP-P2, and a third through-hole OP-P3. The first to third contact parts CE1, CE2, and CE3 may be arranged corresponding to the first to third through-holes OP-P1, OP-P2, and OP-P3, respectively. The light-emitting opening OP-PDL may include a first light-emitting opening OP-PDL1, a second light-emitting opening OP-PDL2, and a third light-emitting opening OP-PDL3. The first to third light-emitting parts EP1, EP2, and EP3 may be defined respectively corresponding to the first to third light-emitting openings OP-PDL1, OP-PDL2, and OP-PDL3. Therefore, the first to third contact parts CE1, CE2, and CE3 may be disposed at positions spaced apart from the first to third light-emitting parts EP1, EP2, and EP3.

Figure 5:
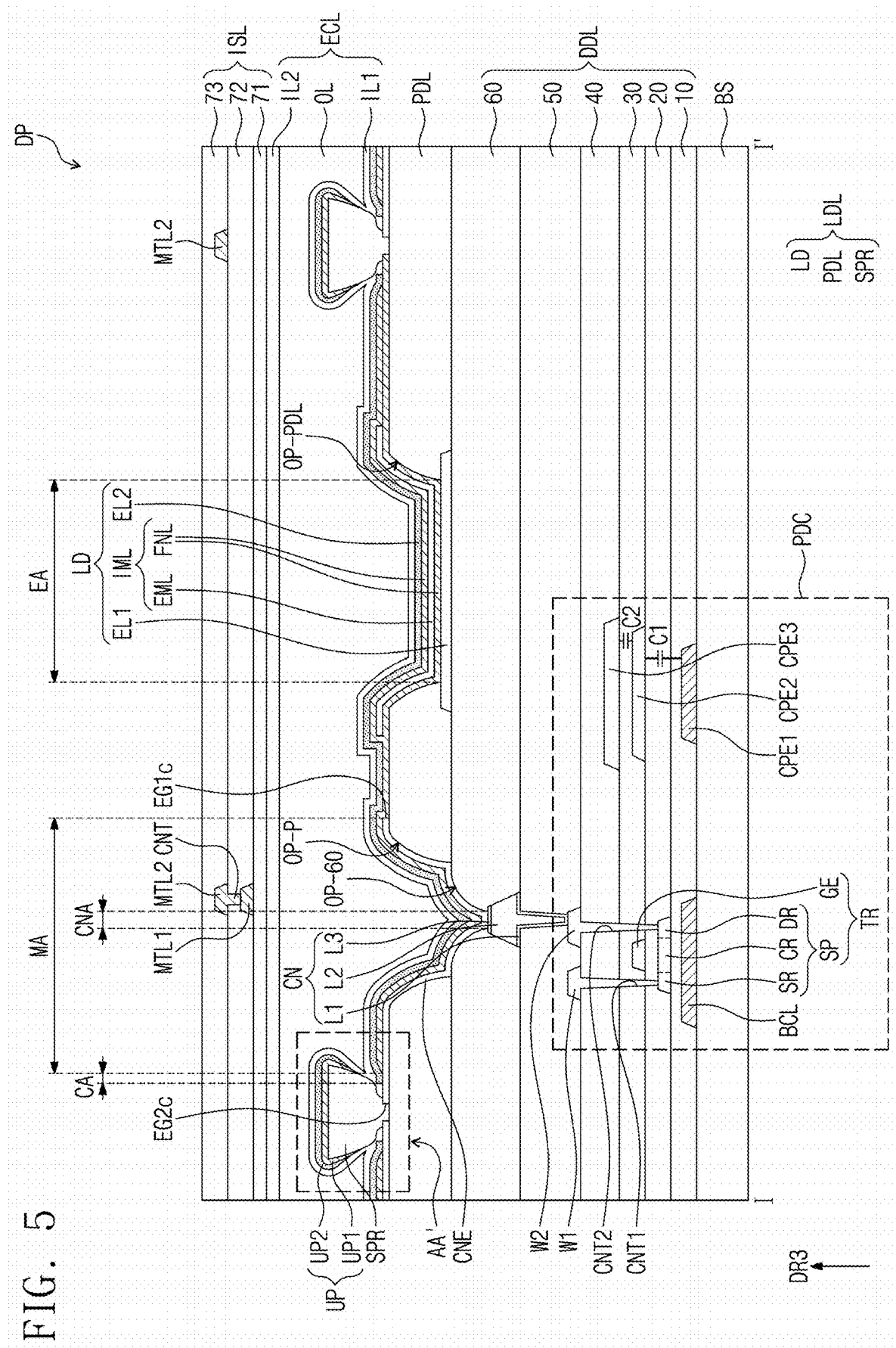
FIG. 5 is a schematic cross-sectional view of a display panel according to an embodiment.

The first to third connection electrodes CNE1, CNE2, and CNE3 may be disposed on the pixel-defining layer PDL (see FIG. 5). When viewed on a plane (or in a plan view), the first connection electrode CNE1 may surround the first light-emitting opening OP-PDL1, the second connection electrode CNE2 may surround the second light-emitting opening OP-PDL2, and the third connection electrode CNE3 may surround the third light-emitting opening OP-PDL3.

According to an embodiment, the driving contact part CD3, which is a position where the connection line CN3 is connected to a transistor TR (see FIG. 5) of the third pixel driver PDC3, may be defined at a position not overlapping the third contact part CE3 on a plane (or in a plan view), and may be disposed at a position overlapping the third light-emitting part EP3. Since the third cathode EL2_3 and the pixel driver PDC3 are connected to each other through the connection line CN3, limitation in designing the pixel driver PDC3 due to the position or shape of the third light-emitting part EP3 may be reduced, so that the degree of freedom of design may be improved.

The first to third cathodes EL2_1, EL2_2, and EL2_3 may be connected to the first to third connection electrodes CNE1, CNE2, and CNE3. For example, lower surfaces of the first to third cathodes EL2_1, EL2_2, and EL2_3 may be connected to (or in contact with) upper surfaces of the first to third connection electrodes CNE1, CNE2, and CNE3, respectively. Therefore, contact reliability (or connection stability) between the first to third cathodes EL2_1, EL2_2, and EL2_3 and the first to third connection electrodes CNE1, CNE2, and CNE3 may be further improved.

For example, connection regions, where the first to third cathodes EL2_1, EL2_2, and EL2_3 and the first to third connection electrodes CNE1, CNE2, and CNE3 are connected, may surround at least portions of the first to third light-emitting openings OP-PDL1, OP-PDL2, and OP-PDL3, respectively. The first to third cathodes EL2_1, EL2_2, and EL2_3 and the first to third connection electrodes CNE1, CNE2, and CNE3 may be connected in regions adjacent to the separator SPR, and the contact regions may each be defined adjacent to the separator SPR. For example, the first to third cathodes EL2_1, EL2_2, and EL2_3 and the first to third connection electrodes CNE1, CNE2, and CNE3 may not be connected in a particular point, and may be connected in a relatively large region, for example in a region similar with a shape of each of the first to third connection electrodes CNE1, CNE2, and CNE3. For example, as the area of contact for connection increases, the connection may be stably performed.

Figure 4D:
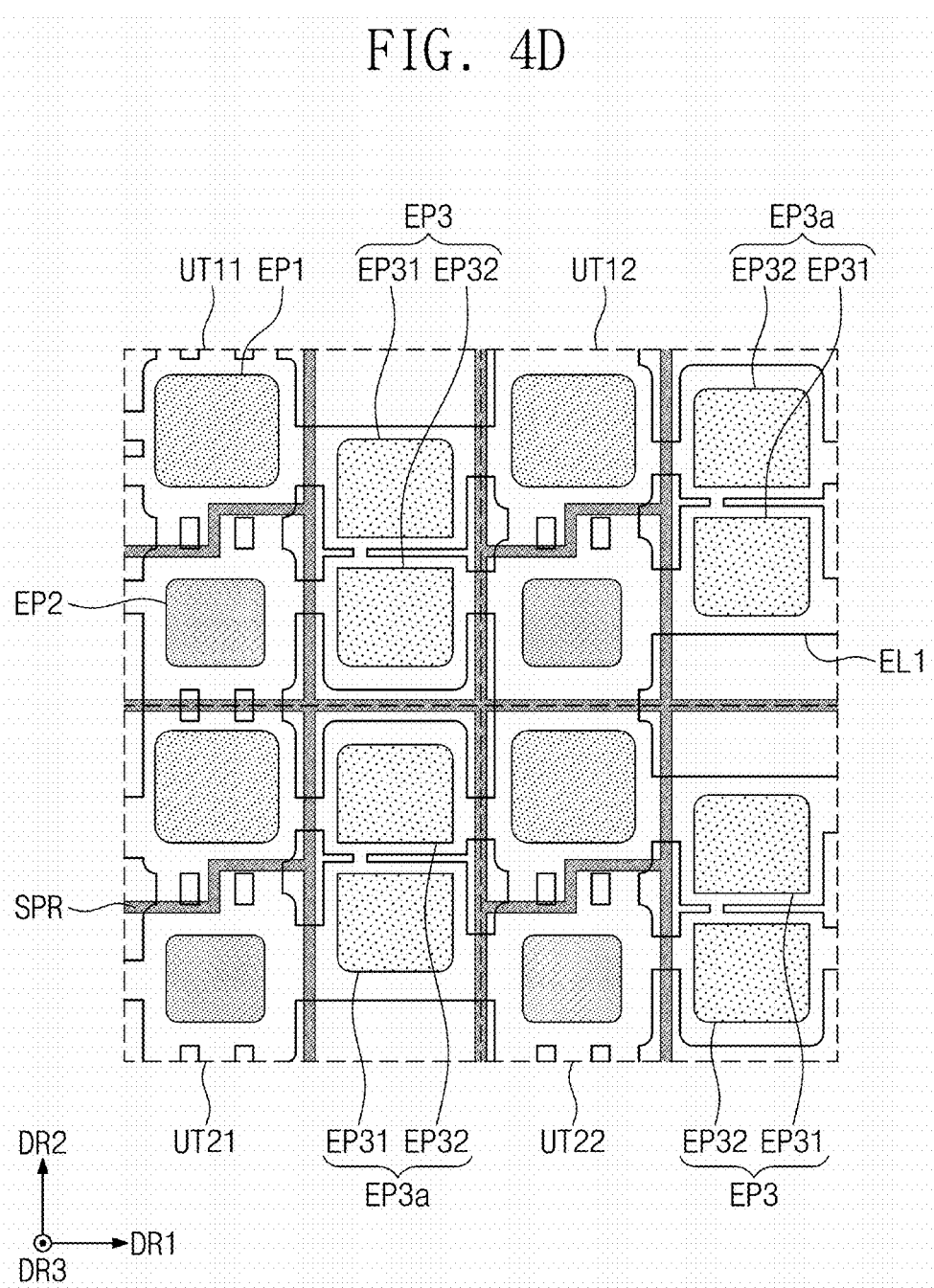
FIG. 4D is an enlarged schematic plan view illustrating a partial region of a display panel according to an embodiment.

FIG. 4D illustrates a separator SPR, light-emitting parts EP1, EP2, and EP3, and a first electrode EL1.

Referring to FIG. 4D, the first electrode EL1 (hereinafter, anode) of a light-emitting element LD (see FIG. 5), according to an embodiment, may be provided to the first to third light-emitting parts EP1, EP2, and EP3 in common. For example, the anode EL1 may be formed as a single layer integrated throughout a display region DA, and accordingly, the anode EL1 may be disposed overlapping the separator SPR. In another example, the anodes EL1 of the light-emitting elements LD may be formed as independent conductive patterns spaced apart from each other, and may also be electrically connected to each other through another conductive layer, and accordingly, the anode EL1 may also be disposed not overlapping the separator SPR.

As previously described, the first power voltage VDD (see FIG. 2A) may be applied to the anode EL1, and a common voltage may be provided to all the light-emitting parts EP. The anode EL1 may be connected to the first power line VDL (see FIG. 2A), which provides the first power voltage VDD, in a peripheral region NDA, or connected to the first power line VDL (see FIG. 2A) in a display region DA, and is not limited to any one embodiment.

For example, openings may be formed (or defined) in the anode EL1 according to an embodiment, and the openings may pass through the anode EL1. The openings in the anode EL1 may be disposed at positions not overlapping the light-emitting parts EP (see FIG. 3A), and generally defined at positions overlapping the separator SPR. The openings may facilitate emission of gas generated from an organic layer disposed under the anode EL1, for example, a sixth insulation layer 60 (see FIG. 5) to be described later. Accordingly, in a display panel manufacturing process, it may be possible to sufficiently emit the gas of the organic layer disposed under the light-emitting element LD, and after the manufacturing process, the gas emitted from the organic layer may be reduced, so that the speed of deterioration in the light-emitting element LD may be lowered.

Figure 6:
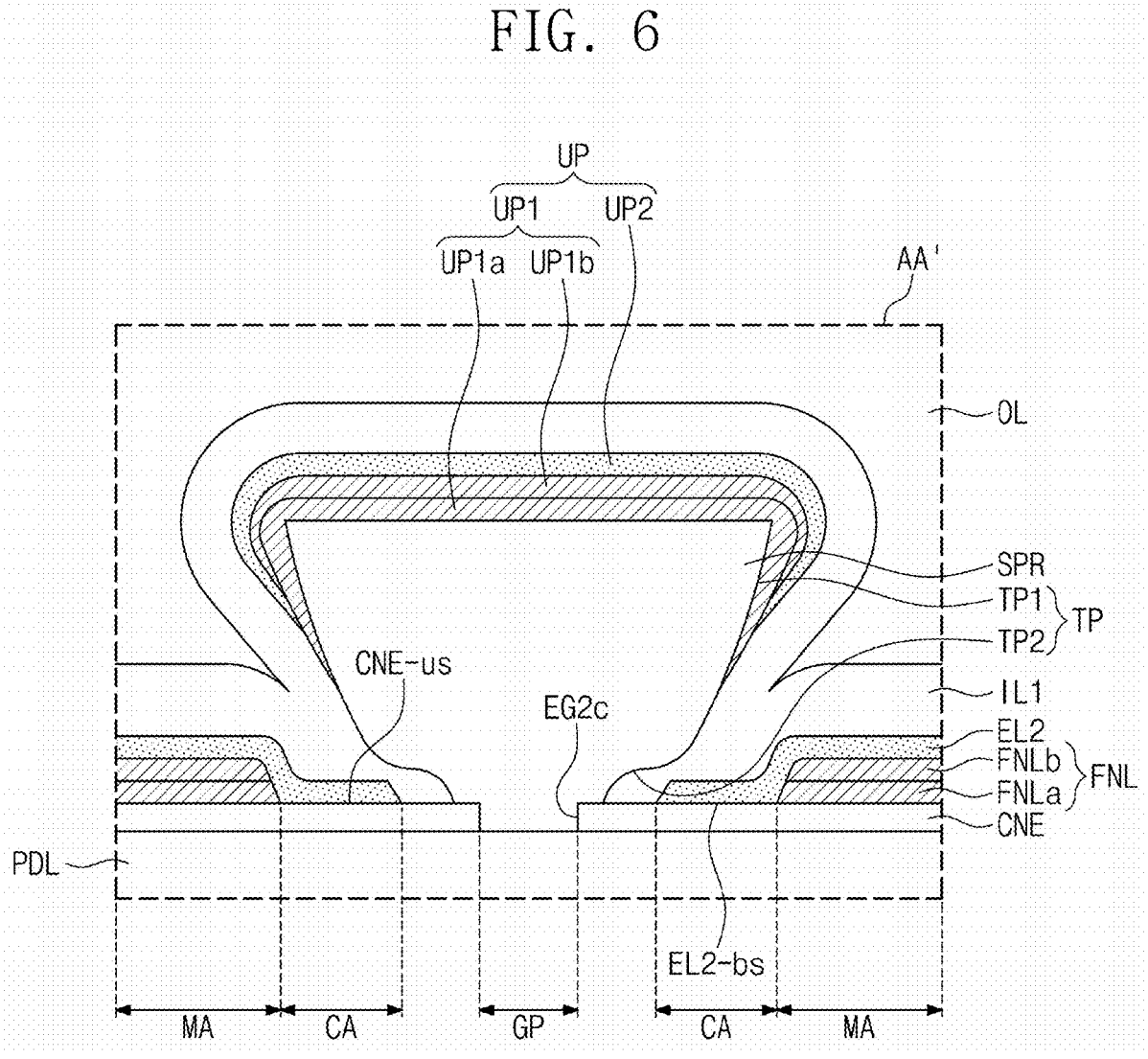
FIG. 6 is an enlarged schematic cross-sectional view illustrating a partial region of a display panel according to an embodiment.

FIG. 5 is a schematic cross-sectional view of a display panel DP according to an embodiment. FIG. 6 is an enlarged schematic cross-sectional view illustrating a partial region of the display panel DP according to an embodiment.

FIG. 5 is a schematic cross-sectional view illustrating a portion corresponding to line I-I' of FIG. 4A. FIG. 6 is an enlarged schematic cross-sectional view of region AA' of FIG. 5.

Referring to FIGS. 5 and 6, the display panel DP according to an embodiment may include a base layer BS, a driving element layer DDL, a light-emitting element layer LDL, an encapsulation layer ECL, and a sensing layer ISL. However, this is an example, and according to an embodiment, the display panel DP may not include the sensing layer ISL.

The driving element layer DDL may include insulation layers 10, 20, 30, 40, 50, and 60 disposed on the base layer BS, and conductive patterns and semiconductor patterns disposed between the insulation layers 10, 20, 30, 40, 50, and 60. The conductive patterns and the semiconductor patterns may be disposed between the insulation layers 10, 20, 30, 40, 50, and 60, and may thus form a pixel driver PDC. For the convenience of description, FIG. 5 illustrates a cross-section of any one portion of a region where a light-emitting part (e.g., a single light-emitting part) is disposed.

The base layer BS may be a member that provides a base surface on which a pixel driver PDC is disposed. The base layer BS may be a rigid substrate or a flexible substrate capable of bending, folding, rolling, and the like. The base layer BS may be a glass substrate, a metal substrate, or a polymer substrate. However, embodiments are not limited thereto, and the base layer BS may also be an inorganic layer, an organic layer, or a composite material layer.

The base layer BS may have a multi-layer structure. The base layer BS may include a first polymer resin layer, a silicon oxide (SiO$_x$) layer disposed on the first polymer resin layer, an amorphous silicon (a-Si) layer disposed on the silicon oxide layer, and a second polymer resin layer disposed on the amorphous silicon layer. The silicon oxide layer and the amorphous silicon layer may be referred to as a base barrier layer.

The polymer resin layer may include a polyimide-based resin. For example, the polymer resin layer may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. In the description, the term "~~based" resin refers to including the functional group of "~~".

The insulation layers, conductive layers, semiconductor layers, disposed on the base layer BS, may each be formed by a coating process, a deposition process, etc. After this, the insulation layer, the semiconductor layer, and the conductive layer may be selectively patterned through multiple cycles of photolithography processes to form a hole in the insulation layer, or to form the semiconductor pattern, the conductive pattern, a signal line, and the like.

The driving element layer DDL may include the first to sixth insulation layers 10, 20, 30, 40, 50, and 60, stacked in sequence on the base layer BS, and the pixel driver PDC. FIG. 5 illustrates one transistor TR and two capacitors C1 and C2 of the pixel driver PDC.

The transistor TR may correspond to a transistor connected to a light-emitting element LD through an intermediate connection electrode CN and the connection electrode CNE. For example, the transistor TR may correspond to a connection transistor connected to a node (e.g., fourth node N4 in FIG. 2A, second node N2 in FIG. 2B, or fourth node N4 in FIG. 2C) corresponding to a cathode of the light-emitting element LD. For example, the transistor TR may correspond to a sixth transistor T6 in FIG. 2A, a first transistor T1 in FIG. 2B, or a fourth transistor T4a in FIG. 2C. For example, other transistors constituting the pixel driver PDC may have the same structure as that of the transistor TR (hereinafter, connection transistor) illustrated in FIG. 5. However, this is an example, and the other transistors constituting the pixel driver PDC may also have a different structure from that of the connection transistor TR, and the structure is not limited to any one embodiment.

A first insulation layer 10 may be disposed on the base layer BS. The first insulation layer 10 may be an inorganic layer and/or an organic layer, and may have a single-layer structure or a multi-layer structure. The first insulation layer 10 may include at least one of aluminum oxide, titanium oxide, silicon oxide, silicon nitride, silicon oxynitride, zirconium oxide, or hafnium oxide. In an embodiment, the first insulation layer 10 is illustrated as a single-layer silicon oxide layer. For example, the insulation layers to be described later may be an inorganic layer and/or an organic layer, and may have a single-layer structure or a multi-layer structure. The inorganic layer may include at least one of the above-mentioned materials, but embodiments are not limited thereto.

For example, the first insulation layer 10 may cover a lower conductive layer BCL. The display panel DP may further include the lower conductive layer BCL disposed overlapping the connection transistor TR. The lower conductive layer BCL may block electrical potential, which is caused by a polarization phenomenon of the base layer BS thereby protecting the connection transistor TR. For example, the lower conductive layer BCL may block light incident from a lower part to the connection transistor TR. At least one of an inorganic barrier layer or a buffer layer may further be disposed between the lower conductive layer BCL and the base layer BS.

The lower conductive layer BCL may include reflective metal. For example, the lower conductive layer BCL may include titanium (Ti), molybdenum (Mo), a molybdenum-containing alloy, aluminum (Al), an aluminum-containing alloy, aluminum nitride (AlM), tungsten (W), tungsten nitride (WN), copper (Cu), and the like.

In an embodiment, the lower conductive layer BCL may be connected to a source of the connection transistor TR (or transistor) through a source electrode pattern W1. For example, the lower conductive layer BCL may be synchronized with the source of the transistor TR to have the same potential or voltage. However, this is an example, and the lower conductive layer BCL may be connected to a gate of the transistor TR to be synchronized with the gate to have the same potential or voltage. In another example, the lower conductive layer BCL may be connected to another electrode, and may thus receive a constant voltage or a pulse signal independently. In another example, the lower conductive layer BCL may also be formed (or provided) in a form isolated from another conductive pattern. The lower conductive layer BCL, according to an embodiment, may be formed (or provided) in various forms, and is not limited to any one embodiment.

The connection transistor TR may be disposed on the first insulation layer 10. The connection transistor TR may include a semiconductor pattern SP and a gate electrode GE. The semiconductor pattern SP may be disposed on the first insulation layer 10. The semiconductor pattern SP may include an oxide semiconductor. For example, the oxide semiconductor may include transparent conductive oxide (TCO) such as indium tin oxide (ITO), indium zinc oxide (IZO), indium gallium zinc oxide (IGZO), zinc oxide (ZnO), or indium oxide (In$_2$O$_3$). However, embodiments are not limited thereto, and the semiconductor pattern SP may also include amorphous silicon, low-temperature polycrystalline silicon, or polycrystalline silicon.

The semiconductor pattern SP may include a source region SR, a drain region DR, and a channel region CR which are distinguished according to the degree of conductivity. The channel region CR may be a portion overlapping the gate electrode GE on a plane (or in a plan view). The source region SR and the drain region DR may be portions spaced apart from each other with the channel region CR therebetween. In case that the semiconductor pattern SP is the oxide semiconductor, the source region SR and the drain region DR may each be a reduced region. Accordingly, the source region SR and the drain region DR may each have the content rate of reduced metal which is relatively higher than that of the channel region CR. In another example, in case that the semiconductor pattern SP is the polycrystalline silicon, the source region SR and the drain region DR may each be a region doped with high concentration.

The source region SR and the drain region DR may have relatively higher conductivity than that of the channel region CR. The source region SR may correspond to a source electrode of the connection transistor TR, and the drain region DR may correspond to a drain electrode of the connection transistor TR. As illustrated in FIG. 5, a separate source electrode pattern W1 and drain electrode pattern W2, respectively connected to the source region SR and the drain region DR, may also be further provided. For example, the separate source electrode pattern W1 and drain electrode pattern W2 may each be formed in an integrated form with one among the lines constituting the pixel driver PDC in FIG. 2A, PDC-1 in FIG. 2B, or PDC-2 in FIG. 2C, and are not limited to any one embodiment.

A second insulation layer 20 may overlap pixels in common, and cover the semiconductor pattern SP. The second insulation layer 20 may be an inorganic layer and/or an organic layer, and may have a single-layer structure or a multi-layer structure. The second insulation layer 20 may include at least one of aluminum oxide, titanium oxide, silicon oxide, silicon nitride, silicon oxynitride, zirconium oxide, or hafnium oxide. In an embodiment, the second insulation layer 20 may be a single-layer silicon oxide layer.

The gate electrode GE may be disposed on the second insulation layer 20. The gate electrode GE may correspond to a gate of the connection transistor TR. For example, the gate electrode GE may be disposed above the semiconductor pattern SP. However, this is an example, and the gate electrode GE may also be disposed under the semiconductor pattern SP, and is not limited to any one embodiment.

The gate electrode GE may include titanium (Ti), silver (Ag), molybdenum (Mo), aluminum (Al), aluminum nitride (AlN), tungsten (W), tungsten nitride (WN), copper (Cu), or an alloy thereof, but embodiments are not limited thereto.

A third insulation layer 30 may be disposed on the gate electrode GE. The third insulation layer 30 may be an inorganic layer and/or an organic layer, and may have a single-layer structure or a multi-layer structure. The third insulation layer 30 may include at least one of aluminum oxide, titanium oxide, silicon oxide, silicon nitride, silicon oxynitride, zirconium oxide, or hafnium oxide.

A first capacitor electrode CPE1 and a second capacitor electrode CPE2, among conductive patterns W1, W2, CPE1, CPE2, and CPE3, may form the first capacitor C1. The first capacitor electrode CPE1 and the second capacitor electrode CPE2 may be spaced apart from each other with the first insulation layer 10 and the second insulation layer 20 therebetween.

According to an embodiment, the first capacitor electrode CPE1 and the lower conductive layer BCL may also have an integrated shape, and may be formed as the same layer. For example, the second capacitor electrode CPE2 and the gate electrode GE may also have an integrated shape, and may be formed as the same layer.

A third capacitor electrode CPE3 may be disposed on the third insulation layer 30. The third capacitor electrode CPE3 may be spaced apart from the second capacitor electrode CPE2 with the third insulation layer 30 therebetween, and may overlap the second capacitor electrode CPE2 on a plane (or in a plan view). The third capacitor electrode CPE3 may form the second capacitor C2 with the second capacitor electrode CPE2.

A fourth insulation layer 40 may be disposed on the third insulation layer 30 and/or the third capacitor electrode CPE3. The fourth insulation layer 40 may be an inorganic layer and/or an organic layer, and may have a single-layer structure or a multi-layer structure. The fourth insulation layer 40 may include at least one of aluminum oxide, titanium oxide, silicon oxide, silicon nitride, silicon oxynitride, zirconium oxide, or hafnium oxide.

The source electrode pattern W1 and the drain electrode pattern W2 may be disposed on the fourth insulation layer 40. The source electrode pattern W1 may be connected to the source region SR of the connection transistor TR through a first contact hole CNT1, and the source electrode pattern W1 and the source region SR of the semiconductor pattern SP may function as a source of the connection transistor TR. The drain electrode pattern W2 may be connected to the drain region DR of the connection transistor TR through a second contact hole CNT2, and the drain electrode pattern W2 and the drain region DR of the semiconductor pattern SP may function as a drain of the connection transistor TR. A fifth insulation layer 50 may be disposed on the source electrode pattern W1 and the drain electrode pattern W2.

The intermediate connection electrode CN may be disposed on the fifth insulation layer 50. The intermediate connection electrode CN may electrically connect the pixel driver PDC and the light-emitting element LD. For example, the intermediate connection electrode CN may electrically connect the connection transistor TR and the light-emitting element LD. The intermediate connection electrode CN may be a connecting node which connects the pixel driver PDC to the light-emitting element LD. For example, the intermediate connection electrode CN may correspond to the fourth node N4 (see FIG. 2A) illustrated in FIG. 2A, correspond to the second node N2 (see FIG. 2B) illustrated in FIG. 2B, or correspond to the fourth node N4 (see FIG. 2C) illustrated in FIG. 2C.

A sixth insulation layer 60 may be disposed on the intermediate connection electrode CN. The sixth insulation layer 60 may be disposed on the fifth insulation layer 50 to cover at least a portion of the intermediate connection electrode CN. The fifth insulation layer 50 and the sixth insulation layer 60 may each be an organic layer. For example, the fifth insulation layer 50 and the sixth insulation layer 60 may each include a general-purpose polymer such as benzo cyclobutene (BCB), polyimide, hexamethyldisiloxane (HMDSO), polymethylmethacrylate (PMMA), or polystyrene (PS), a polymer derivative having a phenol-based group, acrylate-based polymer, imide-based polymer, aryl ether-based polymer, amide-based polymer, fluorine-based polymer, p-xylene-based polymer, vinyl alcohol-based polymer, and a blend thereof.

A through-hole OP-60 that exposes at least a portion of the intermediate connection electrode CN may be formed (or provided) to the sixth insulation layer 60. The intermediate connection electrode CN may be connected to the connection electrode CNE through the portion exposed from the sixth insulation layer 60, and may thus be electrically connected to the light-emitting element LD. For example, the intermediate connection electrode CN may electrically connect the connection transistor TR and the light-emitting element LD through the connection electrode CNE. In the description, a region where the intermediate connection electrode CN and the connection electrode CNE are connected may be referred to as a connection region CNA. The connection region CNA may be defined by the through-hole OP-60. In another example, in the display panel DP according to an embodiment, the sixth insulation layer 60 may also be omitted, or provided in plurality, and is not limited to any one embodiment. In case of omitting the sixth insulation layer 60, the intermediate connection electrode CN may also be omitted.

The intermediate connection electrode CN may include a first layer L1, a second layer L2, and a third layer L3 stacked in sequence along a third direction DR3. The second layer L2 may include a material different from that of the first layer L1. For example, the second layer L2 and the third layer L3 may include different materials. The second layer L2 may have a thickness relatively greater than that of the first layer L1. For example, the second layer L2 may have a thickness relatively greater than that of the third layer L3. The second layer L2 may include a highly conductive material. In an embodiment, the second layer L2 may include aluminum (Al).

The light-emitting element layer LDL may be disposed on the driving element layer DDL. The light-emitting element layer LDL may include a pixel-defining layer PDL, a light-emitting element LD, and a separator SPR.

The pixel-defining layer PDL may be an organic layer. For example, the pixel-defining layer PDL may include a general-purpose polymer such as benzo cyclobutene (BCB), polyimide, hexamethyldisiloxane (HMDSO), polymethylmethacrylate (PMMA), or polystyrene (PS), a polymer derivative having a phenol-based group, acrylate-based polymer, imide-based polymer, aryl ether-based polymer, amide-based polymer, fluorine-based polymer, p-xylene-based polymer, vinyl alcohol-based polymer, a blend thereof, and the like.

In an embodiment, the pixel-defining layer PDL may have light-absorbing characteristics, and may have, for example, the black color. For example, the pixel-defining layer PDL may include a black coloring agent. The black coloring agent may include a black pigment or black dye. The black coloring agent may include carbon black, metal such as chrome, or an oxide thereof. The pixel-defining layer PDL may correspond to a light-blocking pattern having light-blocking characteristics.

An opening OP-PDL (hereinafter, light-emitting opening) that exposes at least a portion of a first electrode EL1, to be described later, may be formed (or defined) in the pixel-defining layer PDL. The light-emitting opening OP-PDL may be provided in plurality, and disposed respectively corresponding to the light-emitting elements LD. All components of the light-emitting element LD may be disposed overlapping the light-emitting opening OP-PDL, and the light-emitting opening OP-PDL may be substantially a region where light emitted by the light-emitting element LD is displayed. Accordingly, the shape of the first light-emitting part EP1 (see FIG. 4A) may substantially correspond to the shape of the light-emitting opening OP-PDL on a plane (or in a plan view). For example, a region corresponding to the first light-emitting part EP1, e.g., a region defined by the light-emitting opening OP-PDL, may be referred to as a light-emitting region EA.

The connection electrode CNE may be disposed on the pixel-defining layer PDL. The connection electrode CNE may electrically connect the pixel driver PDC to the light-emitting element LD. For example, the pixel driver PDC may be electrically connected to the light-emitting element LD via the intermediate connection electrode CN and the connection electrode CNE. The connection electrode CNE may correspond to the first connection electrode CNE1 illustrated in FIG. 4A. The second connection electrode CNE2 (see FIG. 4A) and the third connection electrode CNE3 (see FIG. 4A) may also have the similar structure to that of the connection electrode CNE.

The connection electrode CNE may include a first edge portion EG1c adjacent to the light-emitting opening OP-PDL and a second edge portion EG2c surrounding the first edge portion EG1c. A second electrode EL2 of the light-emitting element LD may be in contact with the connection electrode CNE in a region adjacent to the second edge portion EG2c.

The connection electrode CNE may include transparent conductive oxide (TCO) such as indium tin oxide (ITO), indium zinc oxide (IZO), indium gallium zinc oxide (IGZO), zinc oxide (ZnO), or indium oxide ($In_2O_3$). However, the material composing the connection electrode CNE is not limited to the above examples. For example, the connection electrode CNE may also include a metal material.

A through-hole OP-P spaced apart from the light-emitting opening OP-PDL may be formed (or defined) in (or may pass through) the pixel-defining layer PDL. The through-hole OP-P may be provided in plurality, and disposed respectively corresponding to the light-emitting elements LD. The size of the through-hole OP-P, formed (or defined) in the pixel-defining layer PDL, may be larger than the size of the through-hole OP-60 formed (or defined) in the sixth insulation layer 60. The connection electrode CNE may be disposed in the through-hole OP-P and the through-hole OP-60, and connected to the intermediate connection electrode CN.

The light-emitting element LD may include a first electrode EL1, an intermediate layer IML, and a second electrode EL2.

The first electrode EL1 may be a transflective, transmissive, or reflective electrode. According to an embodiment, the first electrode EL1 may include a reflection layer formed of silver (Ag), magnesium (Mg), aluminum (Al), platinum (Pt), palladium (Pd), gold (Au), nickel (Ni), neodymium (Nd), iridium (Ir), chrome (Cr), a compound thereof, or the like, and a transparent electrode layer or a semi-transparent electrode layer formed on the reflection layer. The transparent or semi-transparent electrode layer may include at least one selected from the group consisting of indium tin oxide (ITO), indium zinc oxide (IZO), indium gallium zinc oxide (IGZO), zinc oxide (ZnO), or indium oxide ($In_2O_3$), and aluminum-doped zinc oxide (AZO). For example, the first electrode EL1 may include a stacked structure of ITO/Ag/ITO.

In an embodiment, the first electrode EL1 may be an anode of the light-emitting element LD. For example, the first electrode EL1 may be connected to the first power line VDL (see FIG. 2A), and may have the first power voltage VDD (see FIG. 2A) applied thereto. The first electrode EL1 may be connected to the first power line VDL in the display region DA (see FIG. 3A or 3B), or connected to the first power line VDL in the peripheral region NDA. In the latter case, the first power line VDL may be disposed in the peripheral region NDA (see FIG. 3A or 3B), and the first electrode EL1 may have a shape extending to the peripheral region NDA.

On the cross-section in FIG. 5, it is illustrated that the first electrode EL1 overlaps the light-emitting opening OP-PDL, and does not overlap the separator SPR, but as described with reference to FIG. 4D, the first electrodes EL1 of the light-emitting elements LD may have an integrated shape, and may have a mesh shape or a lattice shape where openings are defined in a partial region, For example, the shape of the first electrode EL1 may be variously provided as long as the same first power voltage VDD is applied to the first electrode EL1 of each of the light-emitting elements LD, and is not limited to any one embodiment.

The intermediate layer IML may be disposed between the first electrode EL1 and the second electrode EL2. The intermediate layer IML may include a light-emitting layer EML and a functional layer FNL. The light-emitting element LD may include the intermediate layer IML in various structures, and is not limited to any one embodiment. For example, the functional layer FNL may be formed (or provided) in multiple layers, or formed (or provided) in at least two layers spaced apart from each other with the light-emitting layer EML therebetween.

Referring to FIGS. 5, and 6, the functional layer FNL may be disposed between the first electrode EL1 and the second electrode EL2. The functional layer FNL may include a first intermediate functional layer FNLa disposed between the first electrode EL1 and the light-emitting layer EML, and a second intermediate functional layer FNLb disposed between the second electrode EL2 and the light-emitting layer EML. In an embodiment, the light-emitting layer EML is illustrated to be inserted into the functional layer FNL. For example, it may be understood that the light-emitting layer EML is disposed between the first intermediate functional layer FNLa and the second intermediate functional layer FNLb.

The functional layer FNL may control movement of charges between the first electrode EL1 and the second electrode EL2. For example, the first intermediate functional layer FNLa may include a hole injection/transport material and/or an electron injection/transport material. The second intermediate functional layer FNLb may include at least one of an electron-blocking layer, a hole transport layer, a hole injection layer, a hole-blocking layer, an electron transport layer, an electron injection layer, or a charge generation layer.

The light-emitting layer EML may include an organic light-emitting material. For example, the light-emitting layer EML may include an inorganic light-emitting material, or may be formed (or provided) as a mixed layer of the organic light-emitting material and the inorganic light-emitting material. In an embodiment, the light-emitting layers EML respectively included in the light-emitting parts EP (see FIG. 3A), adjacent to each other, may include light-emitting materials displaying different colors. For example, the light-emitting layer EML included in each of the light-emitting parts EP may provide light of any one color among blue, red, and green colors. However, embodiments are not limited thereto, and all of the light-emitting layers EML disposed on the light-emitting parts EP may also include light-emitting materials displaying the same color. For example, the light-emitting layer EML may provide the blue color light, or white color light.

The second electrode EL2 may be disposed on the intermediate layer IML. As previously described, the second electrode EL2 may be connected to the connection electrode CNE to be electrically connected to the pixel driver PDC. For example, the second electrode EL2 may be electrically connected to the connection transistor TR through the connection electrode CNE.

The separator SPR may be disposed on the pixel-defining layer PDL. For example, the separator SPR may be disposed on a gap GP between the connection electrode CNE, disposed on the pixel-defining layer PDL, and an adjacent connection electrode CNE that is adjacent to the connection electrode CNE.

In an embodiment, the second electrode EL2 and the functional layer FNL may be formed by being deposited on pixels in common using an open mask. For example, the second electrode EL2 and the functional layer FNL may be separated by the separator SPR. As previously described, the separator SPR may have a closed-line shape for each light-emitting part EP, and accordingly, the second electrode EL2 and the functional layer FNL may have a divided shape for each light-emitting part EP. For example, the second electrode EL2 and the intermediate layer IML may be electrically independent of each adjacent pixel.

In an embodiment, the separator SPR may have a reverse-tapered shape. For example, the separator SPR may have a shape with the width increasing as it is away from an upper surface of the pixel-defining layer PDL. A side surface TP of the separator SPR may have a shape inclined from the upper surface of the pixel-defining layer PDL with an obtuse taper angle. However, this is an example, and the taper angle of the separator SPR may be variously set as long as the separator SPR electrically disconnects the second electrode EL2 for each pixel, and for example, the separator SPR may have a dual structure with different taper angles. For example, the separator SPR may have a structure such as a tip portion, and is not limited to any one embodiment.

As illustrated in FIGS. 5 and 6, the separator SPR may have a dual reverse-tapered shape. The side surface TP of the separator SPR may include a first side surface TP1 (or upper separator part) and a second side surface TP2 (or lower separator part) having different taper angles. The taper angle formed by the first side surface TP1 of the separator SPR and the taper angle formed by the second side surface TP2 with respect to the upper surface of the pixel-defining layer PDL may be different from each other. The taper angles may each be an obtuse angle. For example, like in FIG. 6, the taper angle formed by the first side surface TP1 with respect to the upper surface of the pixel-defining layer PDL may be smaller than the taper angle formed by the second side surface TP2 with respect to the upper surface of the pixel-defining layer PDL. However, this is an example, and the taper angles may be variously set as long as the separator SPR electrically disconnects the second electrode EL2 for each pixel. For example, the separator SPR may also have a structure such as a tip portion, and is not limited to any one embodiment.

The separator SPR may include an insulating material, such as an organic insulating material. The separator SPR may also include an inorganic insulating material, may also include multiple layers composed of the organic insulating material and the inorganic insulating material, and may also include a conductive material according to an embodiment.

For example, the type of material is not limited as long as the separator SPR electrically disconnects the second electrode EL2 for each pixel.

A dummy layer UP may be disposed above the separator SPR. The dummy layer UP may include a first dummy layer UP1 disposed on the separator SPR and a second dummy layer UP2 disposed on the first dummy layer UP1. The first dummy layer UP1 and the intermediate layer IML may be formed by the same process, and may include the same material. The first dummy layer UP1 may include a (1-1)-th dummy layer UP1a and a (1-2)-th dummy layer UP1b. The (1-1)-th dummy layer UP1a and the first intermediate functional layer FNLa may be formed by the same process, and may include the same material. The (1-2)-th dummy layer UP1b and the second intermediate functional layer FNLb may be formed by the same process, and may include the same material. The second dummy layer UP2 and the second electrode EL2 may be formed by the same process, and may include the same material. For example, the first dummy layer UP1 and the second dummy layer UP2 may be formed simultaneously in the processes of forming the functional layer FNL and the second electrode EL2. As illustrated in FIG. 6, the dummy layer UP may be formed not only on the upper surface of the separator SPR but also on a portion of the side surface TP. In another embodiment, the display panel DP may not also include the dummy layer UP. The dummy layer UP may not be in contact with the connection electrode CNE or the second electrode EL2. The second dummy layer UP2 included in the dummy layer UP may not be in contact with the connection electrode CNE or the second electrode EL2.

The second electrode EL2 may be in contact with the connection electrode CNE through a contact region CA. The contact region CA may be formed (or provided) to be adjacent to the separator SPR. In the contact region CA, an upper surface CNE-us of the connection electrode CNE may be in contact with a lower surface EL2-bs of the second electrode EL2. For example, since the separator SPR has a reverse-tapered shape and the contact region CA is provided to be adjacent to the separator SPR, at least a portion of the contact region CA, where the second electrode EL2 and the connection electrode CNE are in contact with each other, may be disposed under the side surface TP of the separator SPR.

In an embodiment, at least a portion of the connection electrode CNE may be disposed under the separator SPR. The separator SPR may be disposed on the gap GP between the connection electrode CNE and the adjacent connection electrode that is adjacent to the connection electrode CNE, and the second edge portion EG2c of the second electrode EL2 may be covered by the separator SPR.

The display panel DP according to an embodiment may include an intermediate region MA disposed between the light-emitting region EA where the light-emitting element LD is disposed and the contact region CA. The intermediate region MA may be a region where at least a portion of the intermediate layer IML is disposed. In the intermediate region MA, the functional layer FNL included in the intermediate layer IML may be disposed between the connection electrode CNE and the second electrode EL2. For example, in the intermediate region MA, the connection electrode CNE and the second electrode EL2 may be spaced apart from each other with the functional layer FNL therebetween.

The intermediate region MA may be adjacent to the contact region CA. The functional layer FNL, disposed in the intermediate region MA, may include the first intermediate functional layer FNLa and the second intermediate functional layer FNLb previously described. The first intermediate functional layer FNLa may be disposed between the first electrode EL1 and the light-emitting layer EML in the light-emitting region EA, and the second intermediate functional layer FNLb may be disposed between the second electrode EL2 and the light-emitting layer EML in the light-emitting region EA.

In the display panel DP according to an embodiment, the functional layer FNL and the second electrode EL2 may be formed by different deposition processes. The second electrode EL2 may be formed by a deposition process capable of depositing a deposition material at a lower angle of incidence than a deposition process in which the functional layer FNL is formed. The functional layer FNL may be formed by, for example, a thermal evaporation process, and the second electrode EL2 may be covered by a sputtering process. Accordingly, in the process of forming the functional layer FNL, the material forming the functional layer FNL may not enter (or may not be disposed under) a lower part of the side surface TP of the separator SPR, thereby exposing a portion of the connection electrode CNE, and the second electrode EL2 may be formed to be adjacent to the separator SPR, compared to the functional layer FNL, so that the second electrode EL2 may be in contact with the exposed upper surface CNE-us of the connection electrode CNE. For example, in the processes of forming the functional layer FNL and the second electrode EL2, through the difference in deposition process, the contact region CA where the second electrode EL2 and the connection electrode CNE are in contact with each other may be formed.

For example, as illustrated in FIG. 5, the connection region CNA where the connection electrode CNE is connected to the intermediate connection electrode CN may be disposed between the light-emitting region EA and the contact region CA. The connection region CNA may overlap the intermediate region MA. At least a portion of the intermediate layer IML may overlap the connection region CNA. In the display panel DP according to an embodiment, the functional layer FNL included in the intermediate layer IML may overlap the connection region CNA.

According to an embodiment, the connection electrode CNE may have a shape surrounding at least a portion of the light-emitting region EA where the light-emitting element LD is disposed. Therefore, the degree of freedom of the position where the connection electrode CNE and the light-emitting element LD are connected and the degree of freedom of the position where the connection electrode CNE and the pixel driver PDC are connected may be improved. For example, through the contact region CA where the separator SPR is adjacently defined, the upper surface CNE-us of the connection electrode CNE may be in contact with the lower surface EL2-bs of the second electrode EL2. Accordingly, the contact reliability between the connection electrode CNE and the second electrode EL2 may be improved, and since a lower surface of the connection electrode CNE and an upper surface of the intermediate connection electrode CN are in contact with each other, the contact reliability may be improved. In the display panel DP according to an embodiment, through the described structure, the sizes of the through-holes OP-P and OP-60 for connecting the connection electrode CNE and the intermediate connection electrode CN may be decreased or minimized, and accordingly, the area or resolution of the light-emitting part EP of the display panel DP may be increased.

Referring to FIG. 5 again, the encapsulation layer ECL may be disposed on the light-emitting element layer LDL. The encapsulation layer ECL may cover the light-emitting element LD and cover the separator SPR. The encapsulation layer ECL may include a first inorganic layer IL1, an organic layer OL, and a second inorganic layer IL2 stacked in sequence. However, embodiments are not limited thereto, and the encapsulation layer ECL may further include inorganic layers and organic layers. For example, the encapsulation layer ECL may be a glass substrate.

The first and second inorganic layers IL1 and IL2 may protect the light-emitting element LD from moisture and oxygen in the outside of the display panel DP, and the organic layer OL may protect the light-emitting element LD from foreign substances such as particles remaining from a process of forming the first inorganic layer IL1. The first and second inorganic layers IL1 and IL2 may include a silicon nitride layer, a silicon oxynitride layer, a silicon oxide layer, a titanium oxide layer, an aluminum oxide layer, or the like. The organic layer OL may include an acrylate-based organic layer, and the type of material is not limited to any one embodiment.

The sensing layer ISL may sense an external input. In an embodiment, the sensing layer ISL may be formed on the encapsulation layer ECL by a continuous process. For example, the sensing layer ISL may be described to be directly disposed on the encapsulation layer ECL. "To be directly disposed" may mean that there is no intervening component disposed between the sensing layer ISL and the encapsulation layer ECL. For example, there may be no separate adhesion member disposed between the sensing layer ISL and the encapsulation layer ECL. However, this is an example, and in the display panel DP according to an embodiment, the sensing layer ISL may also be formed separately, then bonded to the display panel DP through the adhesion member, and is not limited to any one embodiment.

The sensing layer ISL may include conductive layers and insulation layers. The conductive layers may include a first sensing conductive layer MTL1 and a second sensing conductive layer MTL2, and the insulation layers may include first to third sensing insulation layers 71, 72, and 73. However, this is an example, and the number of conductive layers and the number of insulation layers are not limited to any one embodiment.

The first to third sensing insulation layers 71, 72, and 73 may each have a single-layer structure, or may have a structure of multiple layers stacked along the third direction DR3. The first to third sensing insulation layers 71, 72, and 73 may each include an inorganic film. The inorganic film may include at least one of aluminum oxide, titanium oxide, silicon oxide, silicon nitride, silicon oxynitride, zirconium oxide, or hafnium oxide. The first to third sensing insulation layers 71, 72, and 73 may each include an organic film. The organic film may include at least one of an acrylate-based resin, a methacrylate-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

The first sensing conductive layer MTL1 may be disposed between the first sensing insulation layer 71 and the second sensing insulation layer 72, and the second sensing conductive layer MTL2 may be disposed between the second sensing insulation layer 72 and the third sensing insulation layer 73. A portion of the second sensing conductive layer MTL2 may be connected to the first sensing conductive layer MTL1 through a contact hole CNT formed on the second sensing insulation layer 72. The first sensing conductive layer MTL1 and the second sensing conductive layer MTL2 may each have a single-layer structure, or may have a structure of multiple layers stacked along the third direction DR3.

The single-layer sensing conductive layer may include a metal layer or a transparent conductive layer. The metal layer may include molybdenum, silver, titanium, copper, aluminum, or an alloy thereof. The transparent conductive layer may include transparent conductive oxide such as indium tin oxide (ITO), indium zinc oxide (IZO), zinc oxide (ZnO), or indium zinc tin oxide (IZTO). For example, the transparent conductive layer may include a conductive polymer such as PEDOT, a metal nanowire, graphene, etc.

The multi-layer sensing conductive layer may include metal layers. The metal layers may have a three-layer structure, for example, of titanium (Ti)/aluminum (Al)/titanium (Ti). In another example, the multi-layer sensing conductive layer may include at least one metal layer and at least one transparent conductive layer.

The first sensing conductive layer MTL1 and the second sensing conductive layer MTL2 may form a sensor that senses an external input in the sensing layer ISL. The sensor may operate in a capacitance type, and may operate in either a mutual-cap type or self-cap type. However, this is an example, and the sensor may also operate in a resistive type, ultrasonic type, or infrared type, other than the capacitance type, and the type is not limited to any one embodiment.

The first sensing conductive layer MTL1 and the second sensing conductive layer MTL2 may each include transparent conductive oxide, and may also have a metal mesh shape formed of an opaque conductive material. The first sensing conductive layer MTL1 and the second sensing conductive layer MTL2 may have various materials and shapes as long as visibility of an image displayed by the display panel DP does not decrease, and are not limited to any one embodiment.

FIGS. 7A to 7D are enlarged schematic cross-sectional views illustrating a partial region of a display panel DP according to an embodiment. FIG. 7E is an image capturing a partial region of a display panel according to an embodiment. FIGS. 7A to 7D illustrate enlarged schematic cross-sectional views of a region corresponding to AA' of FIG. 5 as illustrated in FIG. 6, and illustrate the shape of a portion corresponding to a separator SPR and a contact region CA according to a different embodiment from the embodiment illustrated in FIG. 6. For example, the components previously described with reference to FIGS. 5 and 6 are denoted as the same reference numerals or symbols, and the detailed descriptions thereof are omitted for descriptive convenience.

Figure 7A:
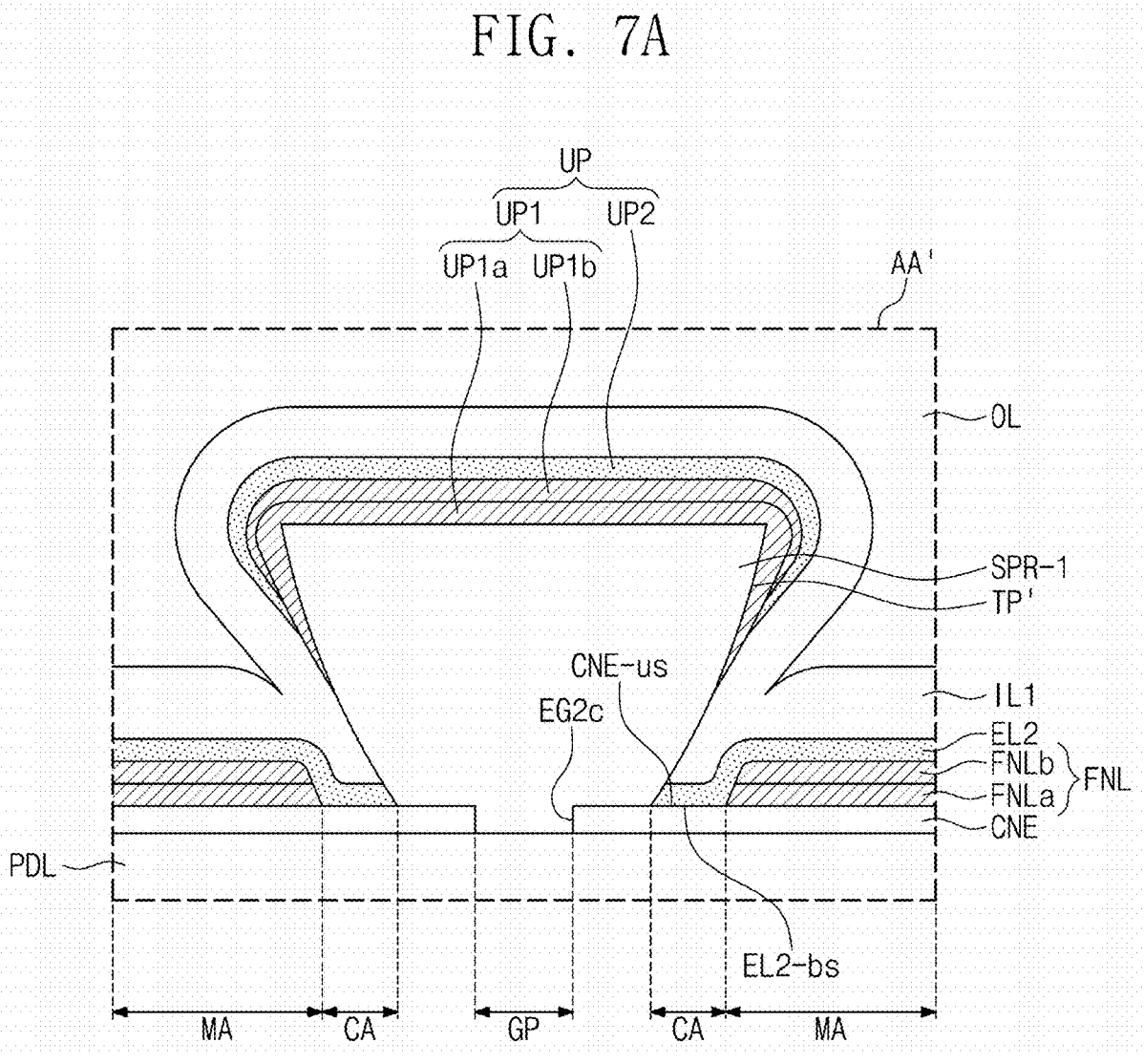
FIGS. 7A to 7D are enlarged schematic cross-sectional views illustrating a partial region of a display panel according to an embodiment.

Referring to FIG. 7A, a separator SPR-1, unlike what is illustrated in FIG. 6, may also have a single reverse-tapered shape, not the dual reverse-tapered shape. For example, a side surface TP' of the separator SPR-1 may include a surface with a uniform taper angle. The side surface TP' of the separator SPR-1 may not include an inflection point where the taper angle changes sharply, and may include a gradual curved surface.

In an embodiment to be described later, the separator SPR having the dual reverse-tapered shape illustrated in FIG. 6 is illustrated, but embodiments are not limited thereto, and in the display panel according to an embodiment to be described later, the separator SPR-1 having the single reverse-tapered shape, illustrated in FIG. 7A, may also be applied.

Figure 7B:
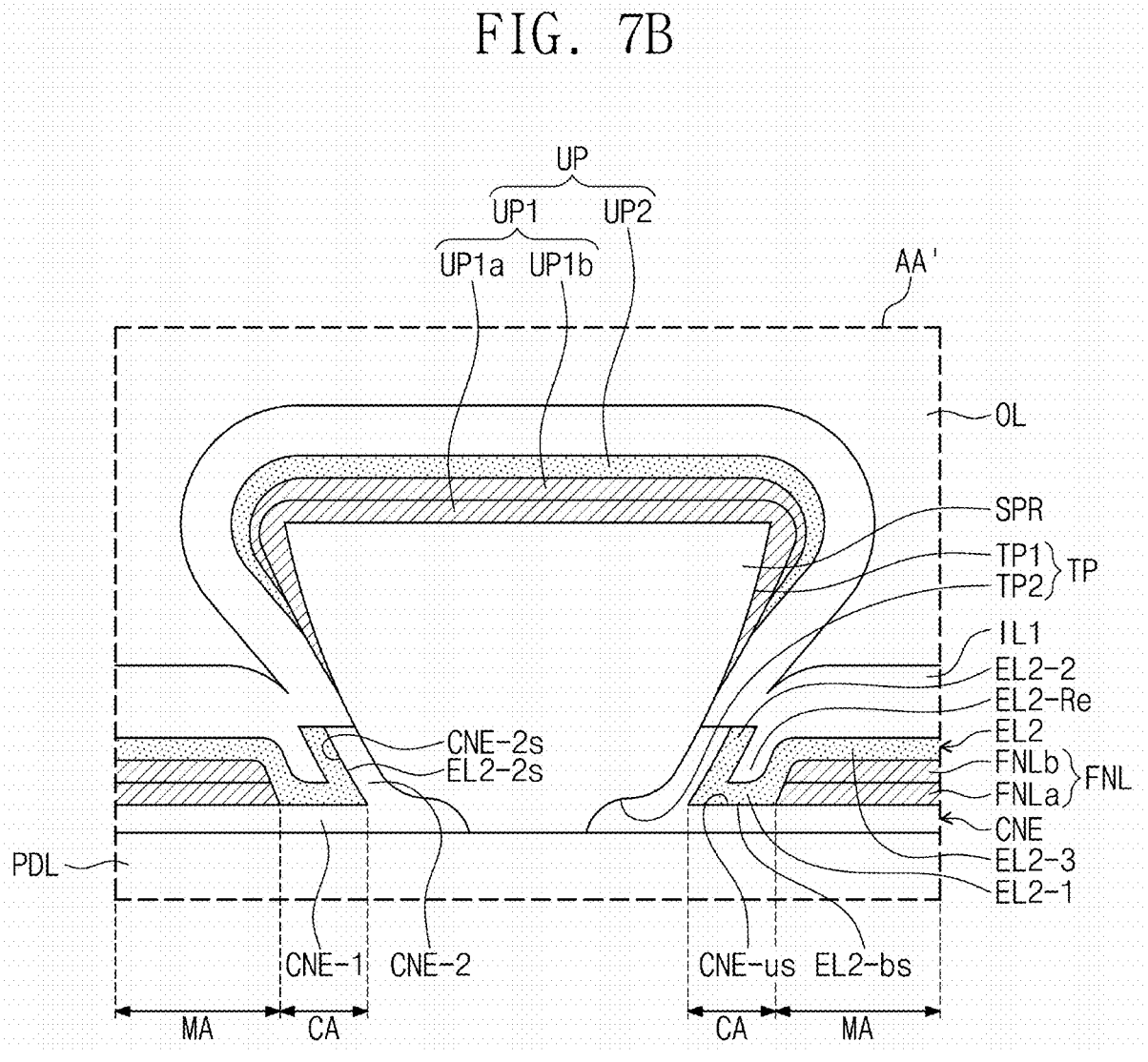

Referring to FIG. 7B, a connection electrode CNE may further include a portion disposed on a side surface TP of a separator SPR, in addition to a portion disposed in a contact region CA. The connection electrode CNE may include a first connection part CNE-1 disposed in the contact region CA, and a second connection part CNE-2 disposed on the side surface TP of the separator SPR. The second connection part CNE-2 may be disposed on a portion of a lower part of the side surface TP of the separator SPR. The second connection part CNE-2 may be in contact with the side surface TP of the separator SPR. The second connection part CNE-2 may be in contact with a second side surface TP2 of the side surface TP of the separator SPR, and may be in contact with a portion of a first side surface TP1.

A second electrode EL2 may include a portion in contact with the connection electrode CNE in the contact region CA, and a portion in contact with the portion of the connection electrode CNE disposed on the side surface TP of the separator SPR. The second electrode EL2 may include a second-first electrode part EL2-1 disposed above the first connection part CNE-1, a second-second electrode part EL2-2 in contact with a side surface of the second connection part CNE-2, and a second-third electrode part EL2-3 disposed in the intermediate region MA. A lower surface EL2-bs of the second-first electrode part EL2-1 may be in contact with an upper surface CNE-us of the first connection part CNE-1. A side surface EL2-2s of the second-second electrode part EL2-2 may be in contact with a side surface CNE-2s of the second connection part CNE-2. For example, the second connection part CNE-2 may be disposed between the separator SPR and the second-second electrode part EL2-2 in a horizontal direction parallel to an upper surface of the pixel-defining layer PDL. For example, the second-first electrode part EL2-1, the second-second electrode part EL2-2, and the second-third electrode part EL2-3 may define a recessed portion EL2-Re, which is filled with the first inorganic layer IL1. For example, the second connection part CNE-2 and the second-second electrode part EL2-2 may be disposed between the separator SPR and the recessed portion EL2-Re in the horizontal direction.

Unlike what is illustrated in FIG. 6, a portion of the connection electrode CNE illustrated in FIG. 7B may not be disposed under the separator SPR. The connection electrode CNE may not be disposed under the separator SPR, and may have a structure where a portion be in contact with the side surface TP of the separator SPR. In the display panel DP, according to an embodiment, illustrated in FIGS. 5 and 6, the separator SPR may be formed after the connection electrode CNE is formed, so that the portion of the connection electrode CNE may be disposed under the separator SPR. Unlike this, in the embodiment illustrated in FIG. 7B, the separator SPR may be formed, and then the connection electrode CNE is formed by the following process, so that the portion of the connection electrode CNE may not be disposed under the separator SPR, but may have a shape disposed along the side surface TP. Accordingly, the connection electrode CNE and the second electrode EL2 may be in contact with each other also in the side surface TP of the separator SPR, in addition to the contact region CA, thereby increasing the contact area of the connection electrode CNE and the second electrode EL2. For example, since the area of connection contact increases, the connection may be stably performed.

Figure 7C:
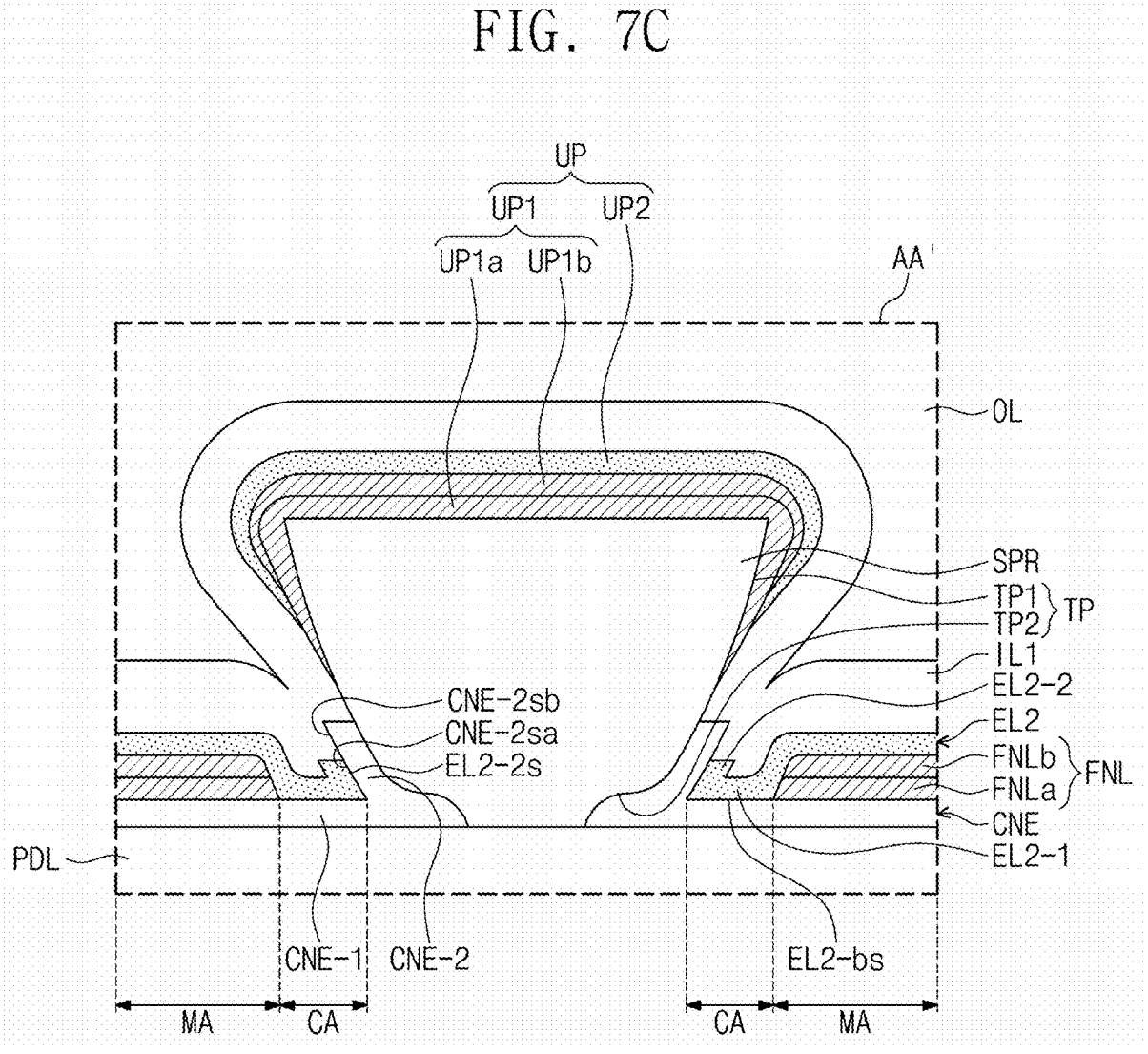

Referring to FIG. 7C, a connection electrode CNE may include a first connection part CNE-1 disposed in a contact region CA, and a second connection part CNE-2 disposed on a side surface TP of a separator SPR. The second connection part CNE-2 may be disposed on a portion of a lower part of the side surface TP of the separator SPR. The second connection part CNE-2 may be in contact with the side surface TP of the separator SPR.

A second electrode EL2 may include a second-first electrode part EL2-1 disposed above the first connection part CNE-1, and a second-second electrode part EL2-2 in contact with a side surface of the second connection part CNE-2.

For example, at least a portion of the second connection part CNE-2 may not be in contact with (or may not be covered by) the second electrode EL2. As illustrated in FIG. 7C, the height of the second connection part CNE-2 may be greater than the height of the second-second electrode part EL2-2, and a portion of the side surface of the second connection part CNE-2 may not be covered, and may be exposed, by the second-second electrode part EL2-2. The second connection part CNE-2 may include a first side surface CNE-2*sa* in contact with a side surface EL2-2*s* of the second-second electrode part EL2-2, and a second side surface CNE-2*sb* that is exposed, and not in contact with (or may not be covered by) the second-second electrode part EL2-2.

Figure 7D:
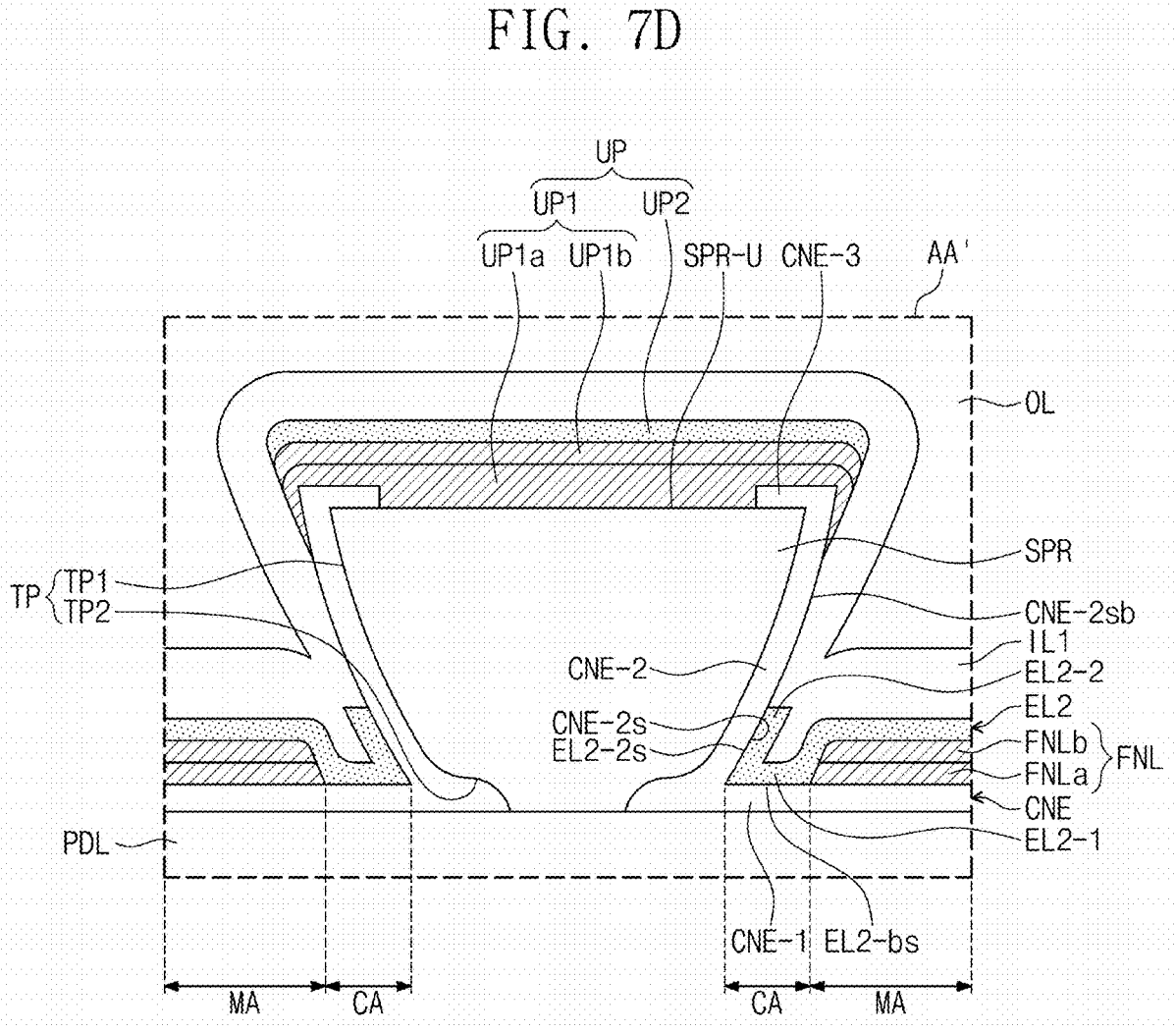
Figure 7E:
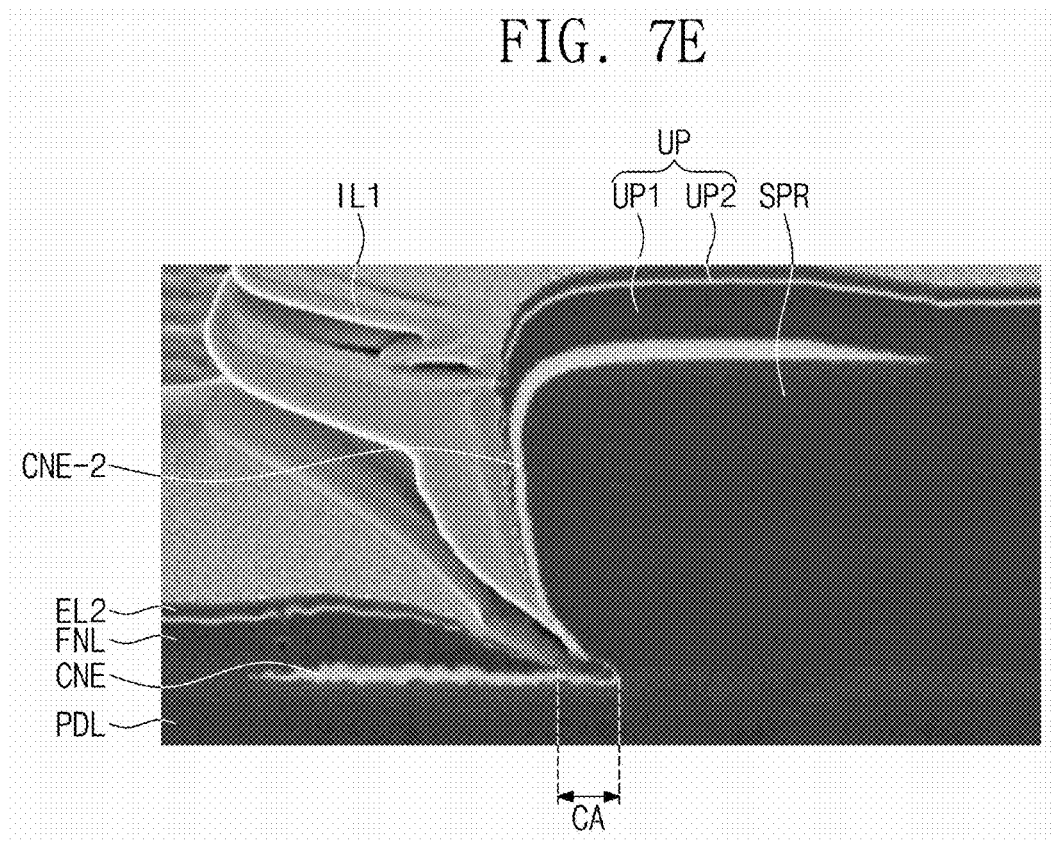
FIG. 7E is an image capturing a partial region of a display panel according to an embodiment.

Referring to FIGS. 7D and 7E, a portion of a connection electrode CNE may also be disposed above a separator SPR. The connection electrode CNE may further include a third connection part CNE-3 disposed on a portion of an upper surface SPR-U of the separator SPR. In an embodiment, a second connection part CNE-2 of the connection electrode CNE may cover the entire side surface TP of the separator SPR, and may be connected to the third connection part CNE-3 disposed on the portion of the upper surface SPR-U of the separator SPR.

For example, at least a portion of the second connection part CNE-2 may not be in contact with a second electrode EL2. As illustrated in FIG. 7D, unlike the second connection part CNE-2 corresponding to the entire side surface TP of the separator SPR, the second-second electrode part EL2-2 may be disposed to correspond to only a portion of the side surface TP of the separator SPR. A portion of the side surface of the second connection part CNE-2 may not be covered, but exposed, by the second-second electrode part EL2-2.

The third connection part CNE-3 disposed on the upper surface SPR-U of the separator SPR may not be in contact with a second dummy layer UP2. In the display panel DP according to an embodiment, even though a portion of the connection electrode CNE is disposed on the upper surface SPR-U of the separator SPR, the portion may not be in contact with the second dummy layer UP2, and thus it may be possible to prevent lateral leakage current that occurs in case that the connection electrode CNE is in contact with the second dummy layer UP2.

Figure 8A:
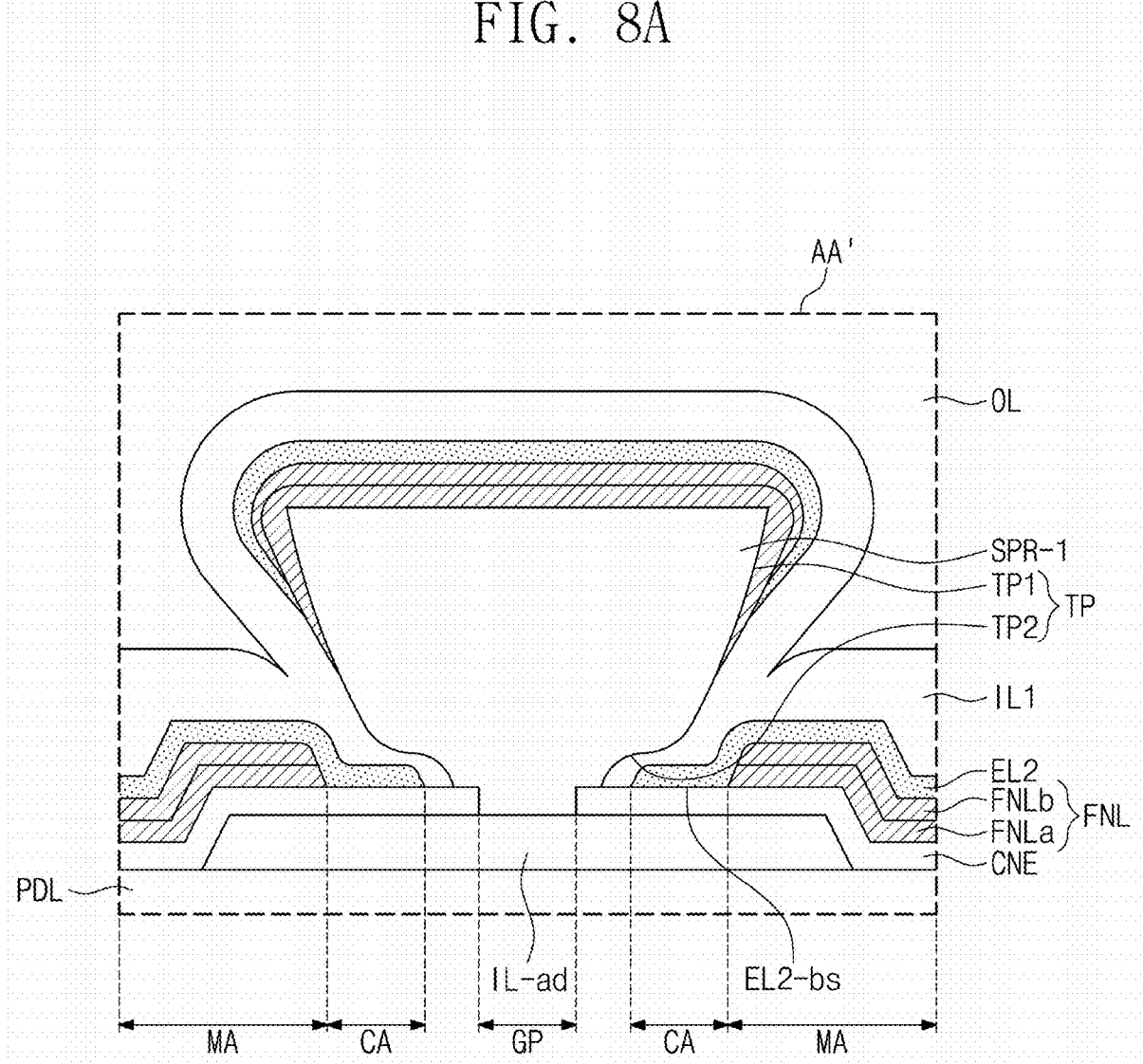
FIGS. 8A and 8B are enlarged schematic cross-sectional views illustrating a partial region of a display panel according to an embodiment.
Figure 8B:
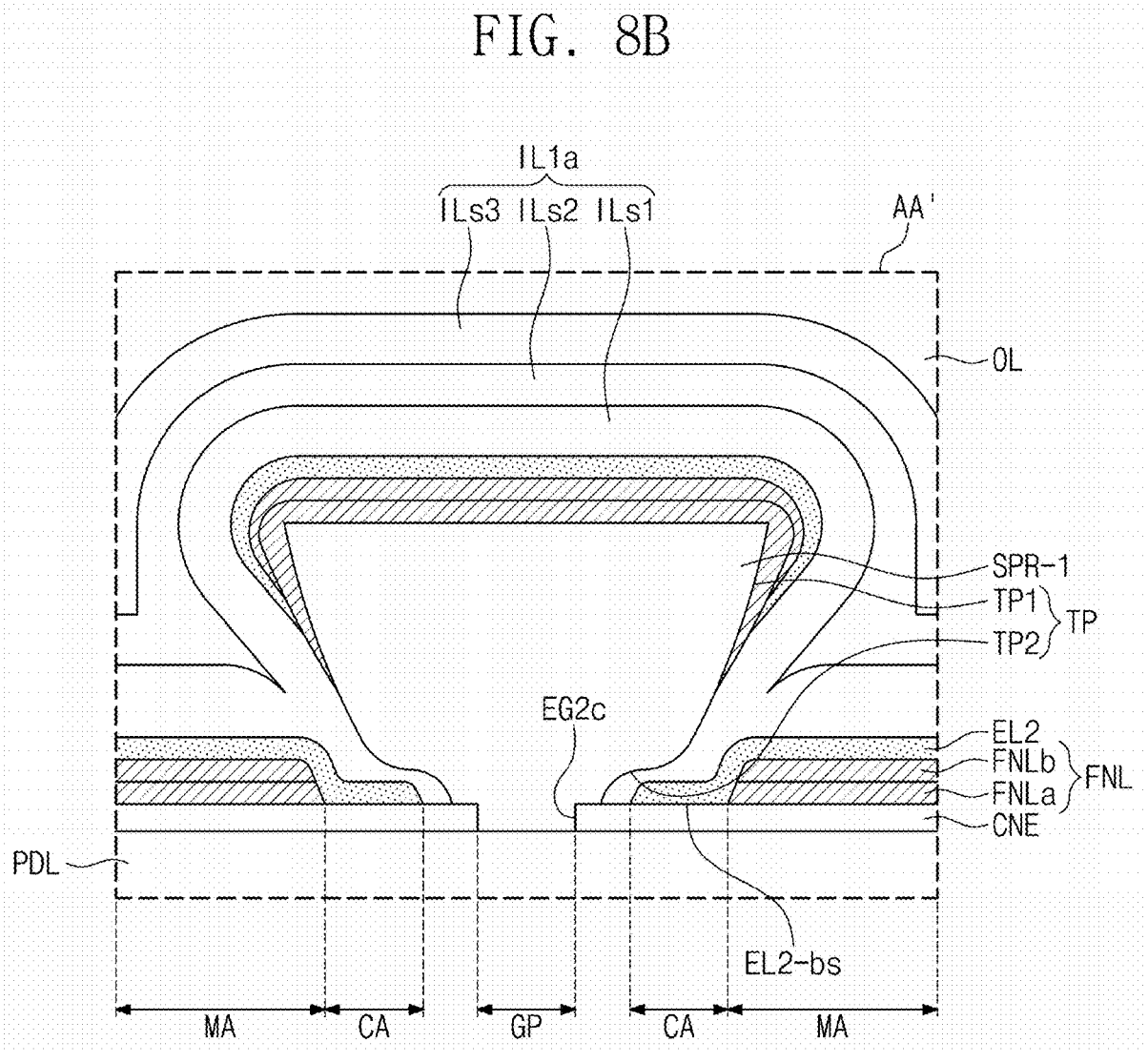

FIGS. 8A and 8B are enlarged schematic cross-sectional views each illustrating a partial region of a display panel according to an embodiment. For example, FIGS. 8A and 8B are enlarged schematic cross-sectional views each illustrating a region corresponding to region AA' of FIG. 7A.

Referring to FIGS. 5 and 8A, the display panel DP may further include a lower encapsulation layer IL-ad. The lower encapsulation layer IL-ad may be disposed between the pixel-defining layer PDL and the separator SPR. In an embodiment where the lower encapsulation layer IL-ad is applied, a portion of the connection electrode CNE may be disposed on the lower encapsulation layer IL-ad. The lower encapsulation layer IL-ad may be an inorganic layer.

Even though a gap is formed in the first inorganic layer IL1 at a portion adjacent to the side surface of the separator SPR, the gap may be shielded by the lower encapsulation layer IL-ad. Therefore, even though the gap functions as an outgassing route or vapor route of the organic layer OL, the gas, moisture, and the like may be shielded by the lower encapsulation layer IL-ad. Therefore, the function of protecting the light-emitting element LD may be improved, and as a result, the reliability of the display panel DP may be improved.

Referring to FIGS. 5 and 8B, a first encapsulation layer IL1*a*, instead of the first inorganic layer IL1 illustrated in FIG. 5, may be applied. The first encapsulation layer IL1*a* may include sub-encapsulation layers ILs1, ILs2, and ILs3. Therefore, the first encapsulation layer IL1*a* may cover the separator SPR relatively gradually. Therefore, a gap, which is formed at a portion adjacent to the side surface of the separator SPR, may be removed from an upper surface of the first encapsulation layer IL1*a*. Therefore, the function of the encapsulation layer for protecting the light-emitting element LD may be improved.

According to an embodiment, the first encapsulation layer IL1*a* may include a first sub-encapsulation layer ILs1, a second sub-encapsulation layer ILs2, and a third sub-encapsulation layer ILs3. The first sub-encapsulation layer ILs1 may cover the separator SPR. The second sub-encapsulation layer ILs2 may be disposed on the first sub-encapsulation ILs1. The third sub-encapsulation layer ILs3 may be disposed on the second sub-encapsulation layer ILs2. However, this is an example, and some of the sub-encapsulation layers constituting the first encapsulation layer IL1*a* may be omitted, or more sub-encapsulation layers may also be included.

According to an embodiment, at least some among the first to third sub-encapsulation layers ILs1, ILs2, and ILs3 may include an organic material. For example, the first sub-encapsulation layer ILs1 and the third sub-encapsulation layer ILs3 may include an inorganic material, and the second sub-encapsulation layer ILs2 may include an organic material. Even though a gap is formed in the first sub-encapsulation layer Ils1 at a portion adjacent to the side surface of the separator SPR, the gap may be filled by the second sub-encapsulation layer ILs2. For example, the first sub-encapsulation layer ILs1 and the third sub-encapsulation layer ILs3 may include a silicon nitride layer, a silicon oxynitride layer, a silicon oxide layer, a titanium oxide layer, an aluminum oxide layer, or the like. The second sub-encapsulation layer ILs2 may include silicon carbonate $SiOC_x$. However, embodiments are not limited thereto.

According to what is previously described, a light-emitting element LD and a pixel-driving circuit PDC may be stably in contact with each other, so that the contact reliability may be improved. In a display panel DP according to an embodiment, a cathode of the light-emitting element LD and a connection electrode CNE electrically connected to the pixel-driving circuit PDC may be in contact with each other in a region adjacent to a separator SPR which is provided for separating pixels PXij, and may thus be connected to each other in a relatively large region, so that the contact reliability may be improved. For example, since a connection region CNA where a lower surface of the connection electrode CNE is in contact with an upper surface of an intermediate connection electrode CN is disposed between a contact region CA and a light-emitting region EA, and a region where the connection electrode CNE and the cathode are connected and a region where the connection electrode CNE and the intermediate connection electrode CN are connected are separately provided, the sizes of through-holes for connecting the connection electrode CNE and the intermediate connection electrode CN may be reduced or minimized. Therefore, it may be possible to increase the area and the resolution of a light-emitting part EP of the display panel DP.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display panel comprising:
a driving element layer including a pixel driver;
a light-emitting element disposed on the driving element layer, the light-emitting element including:
a first electrode,
an intermediate layer disposed on the first electrode and including at least a light-emitting layer, and
a second electrode disposed on the intermediate layer;
a pixel-defining layer disposed on the driving element layer and including an opening exposing at least a portion of the first electrode;
a connection electrode disposed on the pixel-defining layer and electrically connected to the pixel driver and the second electrode; and
a separator disposed on the pixel-defining layer,
wherein in a contact region adjacent to the separator, a lower surface of the second electrode is in contact with an upper surface of the connection electrode.

2. The display panel of claim 1, wherein
the intermediate layer further comprises a functional layer,
the functional layer includes:
a first intermediate functional layer disposed on the first electrode, and
a second intermediate functional layer disposed on the light-emitting layer, and
the light-emitting layer is disposed between the first intermediate functional layer and the second intermediate functional layer.

3. The display panel of claim 2, further comprising:
a first dummy layer disposed on the separator; and
a second dummy layer disposed on the first dummy layer, wherein
the first dummy layer and the functional layer include a same material, and
the second dummy layer and the second electrode include a same material.

4. The display panel of claim 3, wherein the connection electrode is not in contact with the second dummy layer.

5. The display panel of claim 1, wherein the connection electrode has a ring shape surrounding the opening of the pixel-defining layer.

6. The display panel of claim 1, wherein the contact region surrounds at least a portion of the opening of the pixel-defining layer.

7. The display panel of claim 1, wherein
the connection electrode comprises a first edge portion and a second edge portion surrounding the first edge portion, and
the second edge portion overlaps the separator.

8. The display panel of claim 1, wherein the separator comprises a first side surface and a second side surface having different taper angles with respect to an upper surface of the pixel-defining layer.

9. The display panel of claim 1, wherein a portion of the connection electrode is covered by the separator.

10. The display panel of claim 1, wherein the connection electrode comprises:
a first connection part disposed in the contact region; and
a second connection part disposed on a side surface of the separator.

11. The display panel of claim 10, wherein the second electrode comprises:
a first electrode part disposed on the first connection part to be in contact with an upper surface of the first connection part; and
a second electrode part disposed on a side surface of the second connection part to be in contact with the side surface of the second connection part.

12. The display panel of claim 10, wherein the connection electrode further comprises a third connection part disposed on an upper surface of the separator.

13. The display panel of claim 10, wherein at least a portion of the second connection part is not in contact with the second electrode.

14. The display panel of claim 1, wherein
a through-hole passes through the pixel-defining layer, and
the connection electrode is connected to the pixel driver through the through-hole.

15. The display panel of claim 14, wherein the intermediate layer overlaps the through-hole.

16. The display panel of claim 1, wherein in an intermediate region disposed between the contact region and the light-emitting element, the intermediate layer is disposed between the connection electrode and the second electrode.

17. A display panel comprising:
a driving element layer including a pixel driver;
a light-emitting element disposed on the driving element layer, the light-emitting element including:
a first electrode,
an intermediate layer disposed on the first electrode and including at least a light-emitting layer, and
a second electrode disposed on the intermediate layer;
a pixel-defining layer disposed on the driving element layer and including an opening exposing at least a portion of the first electrode; and
a connection electrode disposed on the pixel-defining layer and electrically connected to the pixel driver and the second electrode, wherein
in a contact region spaced apart from a light-emitting region where the light-emitting element is disposed, a lower surface of the second electrode is in contact with an upper surface of the connection electrode, and
a connection region, where the connection electrode and the pixel driver are connected, is disposed between the contact region and the light-emitting region.

18. The display panel of claim 17, wherein
the pixel-defining layer includes:
an opening overlapping the light-emitting region and exposing the portion of the first electrode, and
a through-hole spaced apart from the opening and overlapping the connection region, and
the connection electrode is connected to the pixel driver through the through-hole.

19. The display panel of claim 17, further comprising:
a separator disposed on the pixel-defining layer and adjacent to the contact region.

20. The display panel of claim 19, wherein the connection electrode comprises:
a first connection part disposed in the contact region; and
a second connection part disposed on a side surface of the separator.

21. The display panel of claim 20, wherein the second electrode comprises:
a first electrode part disposed on the first connection part to be in contact with an upper surface of the first connection part; and a second electrode part disposed on a side surface of the second connection part to be in contact with the side surface of the second connection part.

22. The display panel of claim 20, wherein the connection electrode further comprises a third connection part disposed on an upper surface of the separator.

23. The display panel of claim 20, wherein at least a portion of the second connection part is not in contact with the second electrode.

24. The display panel of claim 19, wherein the intermediate layer further comprises a functional layer, and the display panel further comprises:

a first dummy layer disposed on the separator; and a second dummy layer disposed on the first dummy layer, wherein the first dummy layer and the functional layer include a same material, and the second dummy layer and the second electrode include a same material.

25. The display panel of claim 24, wherein the connection electrode is not in contact with the second dummy layer.

26. A display panel comprising:

a driving element layer including a plurality of pixel drivers;

a plurality of light-emitting elements disposed on the driving element layer and electrically connected respectively to the plurality of pixel drivers;

a plurality of connection electrodes connected to the plurality of pixel drivers and the plurality of light-emitting elements; and a separator disposed between the plurality of light-emitting elements, wherein each of the plurality of light-emitting elements includes:

a first electrode, an intermediate layer disposed on the first electrode, and a second electrode disposed on the intermediate layer, and in a contact region adjacent to the separator, a lower surface of the second electrode of each of the plurality of light-emitting elements is in contact with an upper surface of a corresponding connection electrode among the plurality of connection electrodes.

27. The display panel of claim 26, further comprising:

a pixel-defining layer disposed on the driving element layer and including an opening exposing at least a portion of the first electrode of each of the plurality of light-emitting elements, wherein a portion of each of the plurality of connection electrodes is disposed on the pixel-defining layer, and the separator is disposed on the pixel-defining layer.

28. The display panel of claim 27, wherein the plurality of light-emitting elements comprise:

a first light-emitting element, a second light-emitting element spaced apart from the first light-emitting element in a first direction, and a third light-emitting element spaced apart from the first and second light-emitting elements in a second direction intersecting the first direction, the pixel-defining layer includes:

a first opening exposing at least a portion of the first electrode of the first light-emitting element, a second opening exposing at least a portion of the first electrode of the second light-emitting element, and a third opening exposing at least a portion of the first electrode of the third light-emitting element, and the plurality of connection electrodes comprise:

a first connection electrode surrounding the first opening, a second connection electrode surrounding the second opening, and a third connection electrode surrounding the third opening.

29. The display panel of claim 28, wherein the plurality of pixel drivers comprise:

a first pixel driver electrically connected to the first light-emitting element, a second pixel driver electrically connected to the second light-emitting element, and a third pixel driver electrically connected to the third light-emitting element, a first through-hole, a second through-hole, and a third through-hole pass through the pixel-defining layer, the first connection electrode is connected to the first pixel driver through the first through-hole, the second connection electrode is connected to the second pixel driver through the second through-hole, and the third connection electrode is connected to the third pixel driver through the third through-hole.

* * * * *